(12) United States Patent
Falster et al.

(10) Patent No.: US 6,605,150 B2
(45) Date of Patent: *Aug. 12, 2003

(54) LOW DEFECT DENSITY REGIONS OF SELF-INTERSTITIAL DOMINATED SILICON

(75) Inventors: Robert J. Falster, Milan (IT); Joseph C. Holzer, St. Charles, MO (US)

(73) Assignee: MEMC Electronic Materials, Inc., St. Peters, MO (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/135,174

(22) Filed: Apr. 30, 2002

(65) Prior Publication Data

US 2002/0139294 A1 Oct. 3, 2002

Related U.S. Application Data

(63) Continuation of application No. 09/833,777, filed on Apr. 12, 2001, now Pat. No. 6,409,827, which is a continuation of application No. 09/057,907, filed on Apr. 9, 1998, now Pat. No. 6,287,380
(60) Provisional application No. 60/041,845, filed on Apr. 9, 1997.

(51) Int. Cl.$^7$ .............................................. C30B 15/14
(52) U.S. Cl. .......................... 117/15; 117/13; 117/20; 117/29; 117/932; 423/348
(58) Field of Search .................... 117/15, 3, 20, 117/29, 932; 423/348

(56) References Cited

U.S. PATENT DOCUMENTS

| | | |
|---|---|---|
| 3,997,368 A | 12/1976 | Petroff et al. |
| 4,314,595 A | 2/1982 | Yamamoto et al. |
| 4,981,549 A | 1/1991 | Yamashita et al. |
| 5,264,189 A | 11/1993 | Yamashita et al. |
| 5,474,020 A | 12/1995 | Bell et al. |
| 5,485,803 A | 1/1996 | Habu |
| 5,487,354 A | 1/1996 | von Ammon et al. |
| 5,502,010 A | 3/1996 | Nadahara et al. |
| 5,667,584 A | 9/1997 | Takano et al. |
| 5,704,973 A | 1/1998 | Sakurada et al. |
| 5,728,211 A | 3/1998 | Takano et al. |
| 5,919,302 A * | 7/1999 | Falster et al. .................. 117/3 |
| 5,935,320 A | 8/1999 | Graef et al. |
| 5,954,873 A | 9/1999 | Hourai et al. |
| 5,968,262 A | 10/1999 | Saishouji et al. |
| 5,968,264 A | 10/1999 | Iida et al. |
| 6,045,610 A | 4/2000 | Park et al. |
| 6,153,008 A | 11/2000 | Von Ammon et al. |
| 6,287,380 B1 * | 9/2001 | Falster et al. .................. 117/13 |
| 6,409,827 B2 * | 6/2002 | Falster et al. .................. 117/13 |

FOREIGN PATENT DOCUMENTS

| | | |
|---|---|---|
| DE | 39 05 626 A1 | 8/1989 |
| DE | 43 23 964 A1 | 1/1994 |

(List continued on next page.)

Primary Examiner—Robert Kunemund
(74) Attorney, Agent, or Firm—Senniger, Powers, Leavitt & Roedel

(57) ABSTRACT

The present invention relates to a single crystal silicon, in wafer and ingot form, which contains an axially symmetric region which is free of agglomerated intrinsic point defects. The region extends from a circumferential edge of the wafer or constant diameter region of an ingot, axially inwardly toward a central axis such that the entire wafer, a constant diameter portion of the ingot, or an annular-shaped portion of wafer or ingot is free of agglomerated intrinsic point defects. The present invention further relates to these axially symmetric regions wherein silicon self-interstitials are the predominant intrinsic point detect.

41 Claims, 17 Drawing Sheets

FOREIGN PATENT DOCUMENTS

| | | |
|---|---|---|
| DE | 44 14 947 A1 | 8/1995 |
| DE | 198 06 045 A1 | 8/1998 |
| EP | 0 504 837 A2 | 9/1992 |
| EP | 0 536 958 A1 | 4/1993 |
| EP | 0 716 168 A1 | 6/1996 |
| EP | 0 503 816 B1 | 9/1996 |
| EP | 0 799 913 A1 | 10/1997 |
| EP | 0 962 556 A1 | 8/1999 |
| GB | 2182 262 A | 5/1987 |
| JP | 2 137 524 A | 10/1984 |
| JP | Hei 2-180789 A | 7/1990 |
| JP | Hei 2-180789 | 7/1990 |
| JP | Hei 2-267195 A | 10/1990 |
| JP | Hei 3-93700 A | 4/1991 |
| JP | Hei 4-042893 | 2/1992 |
| JP | Hei 4-108682 | 4/1992 |
| JP | Hei 4-108682 A | 4/1992 |
| JP | Hei 7-041383 A | 2/1995 |
| JP | Hei 7-206591 A | 8/1995 |
| JP | Hei 8-012493 A | 1/1996 |
| JP | Hei 8-208374 A | 8/1996 |
| JP | Hei 8-268794 | 10/1996 |
| JP | Hei 8-330316 | 12/1996 |
| JP | WO 97/26393 | 7/1997 |
| JP | Hei 9-202690 | 8/1997 |
| JP | Hei 11-157995 A | 6/1999 |
| JP | Hei 11-180800 A | 7/1999 |
| JP | Hei 11-189495 A | 7/1999 |
| JP | Hei 11-199386 A | 7/1999 |
| JP | Hei 11-199387 | 7/1999 |
| WO | WO 98/45507 | 10/1998 |
| WO | WO 98/45508 | 10/1998 |
| WO | WO 98/45509 | 10/1998 |

OTHER PUBLICATIONS

Abe, T., et al., "Swirl Defects in Float–Zoned Silicon Crystals," Physics., vol. 116B, (1985), pp. 139–147.

Abe, T., et al., "The Characteristics of Nitrogen in Silicon Crystals," VLSI Science and Technology/1985, (Electrochem. Soc. Pennington, 1985), Proceedings vol. 85–5, (1985), pp. 543–551.

Abe, T., et al., "Behavior or Point Defects in FZ Silicon Crystals," Semiconductor Silicon 1990, *Proceedings of the Sixth International Symposium of Silicon Materials Science and Technology*, vol. 90–7 (1990), pp. 105–116.

Abe, T., et al., "Dynamic Behavior of Intrinsic Point Defects in FZ and CZ Silicon Crystals," Mat. Res. Soc. Symp. Proc., vol. 262, (1992), pp. 3–13.

Borionetti, G., et al., "Investigation of Low Denisty Defects in Czochralski Silicon Crystals: Their Detectability, Formation Kinetics and Influence on Gate Oxide Intergrity," Electrochemical Society Proceedings, vol. 96–13, pp. 160–169.

De Kock, A.J.R., "Microdefects in Swirl–Free Silicon Crystals," pp. 83–94 (source unknown) (date unknown).

de Kock, A.J.R., "The Elimination of Vacancy–Cluster Formation in Dislocation –Free Silicon Crystals," J. of the Electrochem. Soc.: Solid–State Science and Technology, vol. 118, No. 11, (Nov. 1971), pp. 1851–1856.

de Kock, A.J.R., et al., "Effect of Growth Parameters on Formation and Elimination of Vacancy Clusters in Dislocation–Free Silicon Crystals," Journal of Crystal Growth, vol. 22 (1974), pp. 311–320.

De Kock, A.J.R., "Point Defect Condensation in Dislocation–Free Silicon Crystals", Semiconductor Silicon, 1977, pp. 508–520.

de Kock, A.J.R., et al., "The Effect of Doping on the Formation of Swirl Defects in Dislocation–Free Czochralski–Grown Silicon Crystals," Journal of Crystal Growth, vol. 49 (1980) pp. 718–734.

Dornberger, E., et al., "The Dependence of Ring Like Distributed Stacking Faults on the Axial Temperature Gradient Czochralski Silicon Crystals," Electrochemical Society Proceedings, vol. 95–4 (1995) pp. 294–305.

Dornberger, E., et al., "Simulation of Grown–in Voids in Czochralski Silicon Crystals," Electrochemical Society Proceedings, vol. 97, No. 22 pp. 40–49.

Dornberger, E. et al., "Simulation of Non–Uniform Grown–in Void Distributions in Czochralski Silicon Crystals," Electrochemical Society Proceedings, vol. 98–1 (1998) pp. 490–503.

Dornberger, E., et al., "The Impact of Dwell Time Above 900° C During Crystal Growth on the Gate Oxide Integrity of Silicon Wafers," Electrochemical Society Proceedings, vol. 96–13, pp. 140–151.

Eidenzon, A.M. et al., "Microdefects in Dislocation–Free Silicon Monocrystals," TSVAM Met., No. 3 (1984) pp. 64–67.

Eidenzon, A.M., et al., "Influence of Growth Rate on Swirl Defects in Large Dislocation–Free Crystals of Silicon Grown by the Czochralski Method," Sov. Phys. Crystallogr., vol. 30, No. 5 (1985) pp. 576–580, American Institute of Physics.

Eidenzon, A.M., et al., "Influence of Growth Microdefects on Formation of Microdefects During Hihg–Temperature Treatment of Silicon," Sov. Phys. Crystallogr., vol. 31, No. 2 (1985) pp. 199–203, American Institute of Physics.

Eidenzon, A.M., et al., "Specific Microdefects in Dislocation–Free Silicon Doped With Phosphorus," Sov. Phys. Crystallogr., vol. 33, No. 4 (1988) pp. 561–565, American Institute of Physics.

Eidenzon, A.M., et al., "Interrelation Between Distributions of Growth– and Thermally– Induced Microdefects and impurity Distribution in Dislocation–Free Silicon Grown by the Czochralski Method with a Constant Magnetic Field Acting on the Melt," Sov. Phys. Crystallogr., vol. 35, No. 2 (1990) pp. 250–254, American Institute of Physics.

Eidenzon, A.M., et al., "Classification of Grown–In–Microdefects in Czochralski–Grown Silicon Crystals," Inoranic Materials, vol. 31(4), 1994, pp. 401–409.

Eidenzon, A.M., et al., "Defect–Free Silicon Crystals Grown by the Czochralski Technique," Inorganic Materials, vol. 33, No. 3 (1997) pp. 219–225, Interperiodica Publishing.

Foll, H., et al. "The Formation of Swirl Defects in Silicon by Agglomeration of Self–Interstitials," Journal of Crystal Growth, 1977, pp. 90–1087, vol. 40, North–Holland Publishing Company.

Harada, H., et al., Oxygen Precipitation Enhanced with Vacancies in Silicon, pp. 76–85.

Hourai, M., et al., "Nature and Generation of Grown–In Defects in Czochralski Silicon Crystals," Electrochemical Society Proceedings, vol. 98–1, pp. 453–467.

Hourai, M., et al., "Improvement of Gate Oxide Integrity Characteristics of CZ–Grown Silicon Crystals," Progress in Semiconductor Fabrication presented by: Semiconductor Equipment and Materials International, Semicon/Europa 93, Mar. 30–Apr. 1, 1993, Geneva, Switzerland.

Hourai, M., et al., "Growth Parameters Determining the Type of Grown–In Defects in Czochralski Silicon Crystals," Materials Science Forum, vol. 196–201 (1995) pp. 1713–1718.

Hourai, M., et al., "Formation Behavior of Infrared Light Scattering Defects in Silicon During Czochralski Crystal Growth," J. Electrochem. Soc., vol. 142(9), (1995), 3193–3201.

Kissinger, G., et al., "A Method For studying the Grown–In Defect Density Specta in Czochralski Silicon Wafers," Journal of Electrochemical Society, vol. 144, No. 4 (1997) pp. 1447–1456.

Kitano, et al., "Identification of Vacancy Clusters in FZ–SI Crystals," Phys. Stat. Sol, vol. 127(a), (1991), 341–347.

Majima, et al., "High–Sensitivity Defect Evaluation by a New Preferential Etching Technique for Highly AS–Doped Si Crystals," Jpn. J. Appl. Phys., vol. 36, No. 10 (1997) pp. 6195–6199.

Nagasima, et al., "Observation of Grown–In Defects in CZ–Si Crystal," Meeting of the Japan Society of Applied Physics (1993).

Nakamura, K., et al., "Formation Process of Grown–In Defects in Czochralski Grown Silicon Crystals," Journal of Crystal Growth, vol. 180 (1997) pp. 61–72.

Park, J.G., et al., "Effect of Crystal Defects on Device Characteristics," Electrochemical Society Proceedings, vol. 97–22 (Jul. 16, 1997), pp. 173–195.

Puzanov, N.I., et al., "Influence of Transitional Crystallization Regimes on Microdefects in Silicon," USSR Academy of Sciences Newsletter, vol. 22, No. 8 (1986), pp. 1237–1242.

Puzanov, N.I. et al. "The Effect Of Thermal History During Crystal Growth On Oxygen Precipitation In Czochralski–grown Silicon," Semicond. Sci. Technol., vol. 7 (1992) pp. 406–413.

Puzanov, N.I., et al., "Relaxation in a System of Point Defects in a Growing Dislocation–Free Crystal of Silicon," Sov. Phys. Crystallogr., vol. 31, No. 2 (1986) pp. 219–222, American Institute of Physics.

Puzanov, N.I., et al., "Influence of Growth Conditions on the Formation of Microdefects in Dislocation–Free Silicon," Sov. Phsys. Crystallogr., vol. 34(2), (1989) pp. 273–278.

Puzanov, N.I., et al., "Microdefects in Silicon Grown by the Czochralski Method with a Vertical magnetic Field Acting on the Melt," Sov. Phys. Crystallogr. 35(1), (1990), pp. 102–105.

Puzanov, N.I. et al., "Effects of Silicon Monocrystal Growth Conditions on Oxygen Precipitation During High–Temperature Processing," vol. 37, No. 5 (1992) pp. 1–10.

Puzanov, N.I. et al. "Formation Of The Bands Of Anomalous Oxygen Precipitation In Czochralski–grown Si Crystals," Journal of Crystal Growth 137 (1994) pp. 642–652.

Puzanov, N.I. et al. "The Role Of Intrinsic Point Defects In The Formation Of Oxygen Precipitation Centers In Dislocation–Free Silicon," Crystallography Reports; vol. 41; No. 1(1996) pp. 134–141.

Puzanov, N.I., et al., "Cultivation, Morphology and Structural Integrity of Dislocation–Free Silicon Tetracrystals," Inorganic Materials, vol. 32, No. 8 (1996), pp. 903–912.

Puzanov, N.I., et al., "Modeling Point–Defect Distribution in Dislocation–Free Si Crystals Grown from the Melt," Inorganic Materials, Vo. 32(1), (1996), pp. 1–9.

Puzanov, N.I. et al. "Harmful Microdefects In The Seed–End Portion Of Large–Diameter Silicon Ingots," Inorganic Materials, vol. 33, No. 8 (1997) pp. 765–769.

Puzanov, N.I. et al. "Modelling Microdefect Distribution In Dislocation–Free Si Crystals Grown From The Melt," Journal of Crystal Growth 178 (1997) pp. 468–478.

Roksnoer, P.J., "Effect of Low Cooling Rates on Swirls and Striations in Dislocation–Free Silicon Crystals," vol. 35, (1976), pp. 245–248.

Roksnoer, P.J., "Microdefects in a Non–Striated Distribution in Floating–Zone Silicon Crystals," Journal of Crystal Growth, vol. 53 (1981), pp. 563–573.

Roksnoer, P.J., "The Mechanism of Formation of Microdefects in Silicon," Journal of Crystal Growth, vol. 68 (1984), pp. 596–612.

Ryuta, J, et al., "Crystal–Originated Singularities on Si Wafer Surface after SC1 Cleaning," Japanese Journal of Applied Physics, vol. 29(11) (1990), pp. L1947–L1949.

Seidel, T.E., "Silicon Wafers for the 1990's," Journal of Crystal Growth, vol. 85, (1987), pp. 97–105.

Shimanuki, Y., et al., "Effects of Thermal History on Microdefect Formation in Czochralski Silicon Crystals," Japanese Journal of Applied Physics, vol. 24, No. 12, (1985), pp. 1594–1599.

Sinno, T., et al., "On the Dynamics of the Oxidation–Induced Stacking–Fault Ring in As–Grown Czochralski Silicon Crystals," Applied Physics Letters, vol. 70, No. 17 (1997) pp. 2250–2252.

Sinno, T., et al., "Point Defect Dynamics and the Oxidation–Induced Stacking–Fault Ring in Czochralski–Grown Silicon Crystals," Journal of Electrochemical Society, vol. 145, No. 1 (1998) pp. 302–318.

Stutius, et al., "Growth and Doping of ZnSe and $ZnS_xSe_{1-x}$ by Organometallic Chemical Vapor Deposition," Journal of Crystal Growth, vol. 59 (1982) pp. 1–9.

Tan, T.Y., "Point Defects, Diffusion Processes, and Swirl Defect Formation in Silicon," Appl. Phys. A., vol. 37 (1985) pp. 1–17.

Vanhellemont, J., et al., "Defects in As–Grown Silicon and Their Evolution During Heat Treatments," Materials Science Forum, vols. 258–263 (1997) pp. 341–346.

von Ammon, et al., "The Dependence of Bulk Defects on the Axial Temperature Gradient of Silicon Czochralski Growth," Journal of Crystal Growth, vol. 151 (1995) pp. 273–277.

Voronkov, V., et al., "Behaviour and Effects of Intrinsic Point Defects in the Growth of Large Silicon Crystals," Electrochemical Society Proceedings, vol. 97–22 (1997), pp. 3–17.

Voronkov, V., "The Mechanism of Swirl Defects Formation in Silicon," Journal of Crystal Growth, 59 (1982), pp. 625–643.

Wijaranakula, W., "Numerical Modeling of the Point Defect Aggregation during the Czochralski Silicon Crystal Growth," Journal of Electrochemical Society, vol. 139, No. 2 (Feb. 1992), pp. 604–616.

Wijaranakula, W., "Effect of High–Temperature Annealing on the Dissolution of the D–Defects in N–Type Czochralski Silicon," Appl. Phys. Lett., vol. 64(8), (1994), 1030–1032.

Wijaranakula, W., "Fundamentals of Point Defect Aggregation and Dissolution Phenomena of Crystal Originated Defects in Czochralski Silicon," Materials Science Forum, vols. 196–201 (1995) pp. 1691–1696.

Winkler, R., et al., "Improvement of the Gate Oxide Integrity by Modifying Crystal Pulling and Its Impact on Device Failures," Journal of Electrochemical Society, vol. 141, No. 5 (1994) pp. 1398–1401.

Yamagishi, et al., "Recognition of D Defects in Silicon Signle Crystals by Preferential Etching and Effect on Gate Oxide Integrity", Semicond. Sci Technol. 7, 1992, A135–A140.

Yamauchi, T., et al., "Application of Copper–Decoration Method to Characterize As–Grown Czochralski–Silicon," Jpn. J. Appl. Phys., vol. 31, (1992), pp. L439–L442.

Zimmerman, H., et al. "Gold and Platinum Diffusion: the Key to the Understanding of Intrinsic Point Defect Behavior in Silicon," Applied Physics A Solids and Surfaces, vol. A55, No. 1 (1992) pp. 121–134.

Zimmerman, H., et al., "Vacancy Concentration Wafer Mapping in Silicon," Journal of Crystal Growth 129 (1993) pp. 582–592.

European Search Report for European Patent Application No. EP 1 118 697 A3, dated Sep. 3, 2001, 3 pages.

* cited by examiner

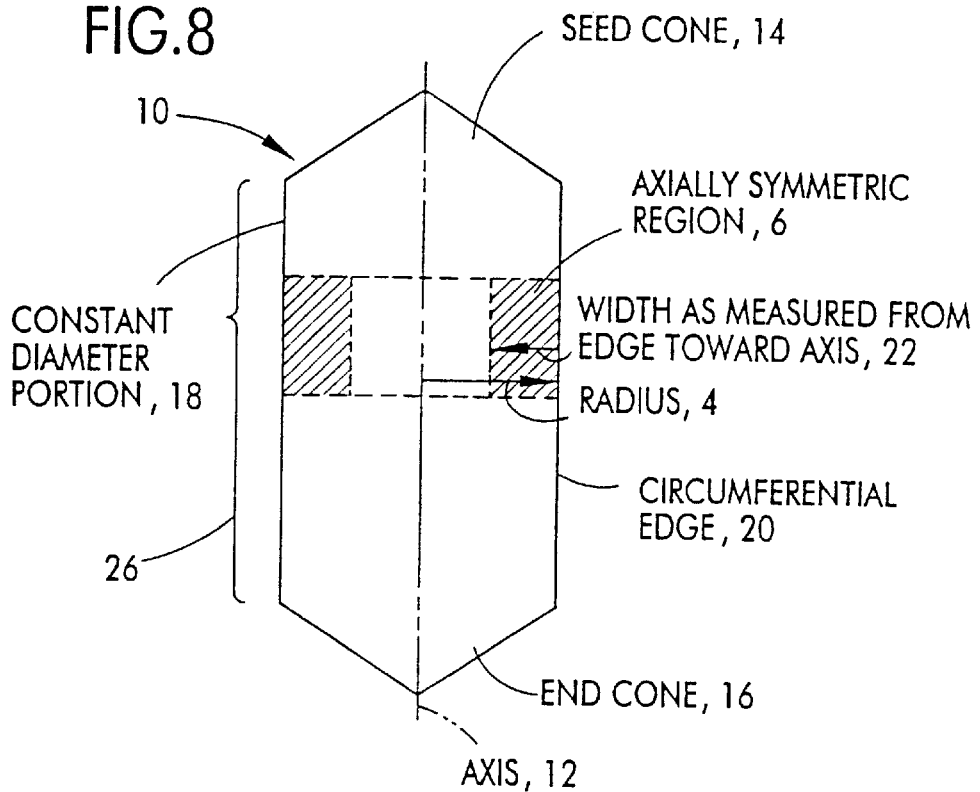
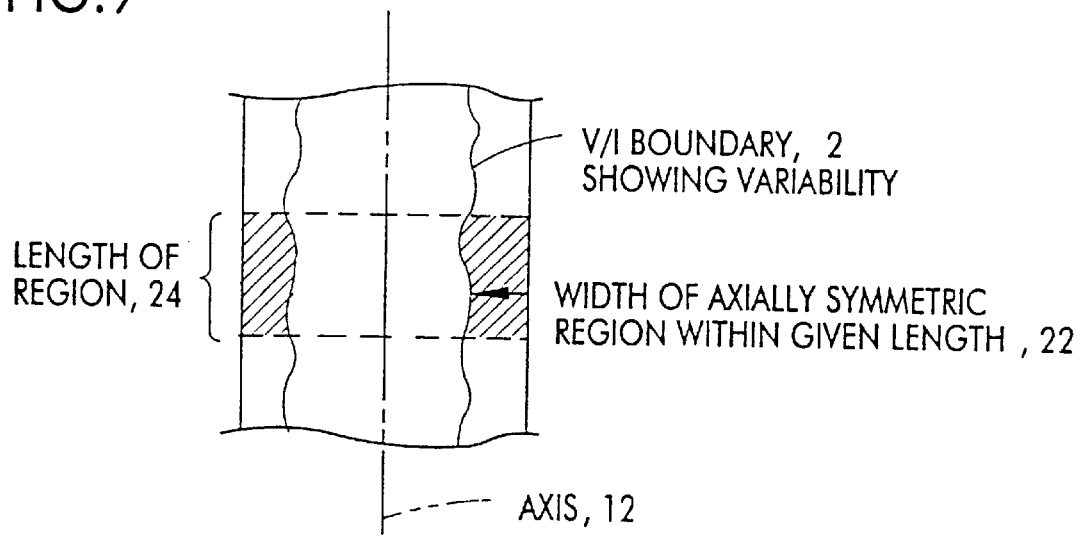

LOW DEFECT DENSITY REGIONS OF SELF-INTERSTITIAL DOMINATED SILICON

CROSS-REFERENCE TO RELATED APPLICATION

This application claims priority from U.S. Provisional Application Ser. No. 60/041,845, filed on Apr. 9, 1997 U.S. application Ser. No. 09/057,907, filed on Apr. 9, 1998, which issued on Sep. 11, 2001 as U.S. Pat. No. 6,287,380, and U.S. application Ser. No. 09/833,777, filed on Apr. 12, 2001 now U.S. Pat. No. 6,409,127.

BACKGROUND OF THE INVENTION

The present invention generally relates to the preparation of semiconductor grade single crystal silicon which is used in the manufacture of electronic components. More particularly, the present invention relates to single crystal silicon ingots and wafers having an axially symmetric region which is devoid of agglomerated intrinsic point defects, and a process for the preparation thereof.

Single crystal silicon, which is the starting material for most processes for the fabrication of semiconductor electronic components, is commonly prepared by the so-called Czochralski ("Cz") method. In this method, polycrystalline silicon ("polysilicon") is charged to a crucible and melted, a seed crystal is brought into contact with the molten silicon and a single crystal is grown by slow extraction. After formation of a neck is complete, the diameter of the crystal is enlarged by decreasing the pulling rate and/or the melt temperature until the desired or target diameter is reached. The cylindrical main body of the crystal which has an approximately constant diameter is then grown by controlling the pull rate and the melt temperature while compensating for the decreasing melt level. Near the end of the growth process but before the crucible is emptied of molten silicon, the crystal diameter must be reduced gradually to form an end-cone. Typically, the end-cone is formed by increasing the crystal pull rate and heat supplied to the crucible. When the diameter becomes small enough, the crystal is then separated from the melt.

In recent years, it has been recognized that a number of defects in single crystal silicon form in the crystal growth chamber as the crystal cools after solidification. Such defects arise, in part, due to the presence of an excess (i.e. a concentration above the solubility limit) of intrinsic point defects, which are known as vacancies and self-interstitials. Silicon crystals grown from a melt are typically grown with an excess of one or the other type of intrinsic point defect, either crystal lattice vacancies ("V") or silicon self-interstitials ("I"). It is understood that the type and initial concentration of these point defects in the silicon, which become fixed at the time of solidification, are controlled by the ratio $v/G_0$, where v is the growth velocity and $G_0$ is the instantaneous axial temperature gradient in the crystal at the time of solidification. Referring to FIG. 1, for increasing values of the ratio $v/G_0$, a transition from decreasingly self-interstitial dominated growth to increasingly vacancy dominated growth occurs near a critical value of $v/G_0$, which based upon currently available information appears to be about $2.1 \times 10^{-5}$ cm$^2$/sK. At the critical value, the concentrations of these intrinsic point defects are at equilibrium.

As the value of $v/G_0$ exceeds the critical value, the concentration of vacancies increases. Likewise, as the value of $v/G_0$ falls below the critical value, the concentration of self-interstitials increases. If these concentrations reach a level of critical supersaturation in the system, and if the mobility of the point defects is sufficiently high, a reaction, or an agglomeration event, will likely occur. Agglomerated intrinsic point defects in silicon can severely impact the yield potential of the material in the production of complex and highly integrated circuits.

Vacancy-type defects are recognized to be the origin of such observable crystal defects as D-defects, Flow Pattern Defects (FPDs), Gate Oxide Integrity (GOI) Defects, Crystal Originated Particle (COP) Defects, crystal originated Light Point Defects (LPDs), as well as certain classes of bulk defects observed by infrared light scattering techniques such as Scanning Infrared Microscopy and Laser Scanning Tomography. Also present in regions of excess vacancies are defects which act as the nuclei for ring oxidation induced stacking faults (OISF). It is speculated that this particular defect is a high temperature nucleated oxygen agglomerate catalyzed by the presence of excess vacancies.

Defects relating to self-interstitials are less well studied. They are generally regarded as being low densities of interstitial-type dislocation loops or networks. Such defects are not responsible for gate oxide integrity failures, an important wafer performance criterion, but they are widely recognized to be the cause of other types of device failures usually associated with current leakage problems.

The density of such vacancy and self-interstitial agglomerated defects in Czochralski silicon is conventionally within the range of about $1*10^3$/cm$^3$ to about $1*10^7$/cm$^3$. While these values are relatively low, agglomerated intrinsic point defects are of rapidly increasing importance to device manufacturers and, in fact, are now seen as yield-limiting factors in device fabrication processes.

To date, there generally exists three main approaches to dealing with the problem of agglomerated intrinsic point defects. The first approach includes methods which focus on crystal pulling techniques in order to reduce the number density of agglomerated intrinsic point defects in the ingot. This approach can be further subdivided into those methods having crystal pulling conditions which result in the formation of vacancy dominated material, and those methods having crystal pulling conditions which result in the formation of self-interstitial dominated material. For example, it has been suggested that the number density of agglomerated defects can be reduced by (i) controlling $v/G_0$ to grow a crystal in which crystal lattice vacancies are the dominant intrinsic point defect, and (ii) influencing the nucleation rate of the agglomerated defects by altering (generally, by slowing down) the cooling rate of the silicon ingot from about 1100° C. to about 1050° C. during the crystal pulling process. While this approach reduces the number density of agglomerated defects, it does not prevent their formation. As the requirements imposed by device manufacturers become more and more stringent, the presence of these defects will continue to become more of a problem.

Others have suggested reducing the pull rate, during the growth of the body of the crystal, to a value less than about 0.4 mm/minute. This suggestion, however, is also not satisfactory because such a slow pull rate leads to reduced throughput for each crystal puller. More importantly, such pull rates lead to the formation of single crystal silicon having a high concentration of self-interstitials. This high concentration, in turn, leads to the formation of agglomerated self-interstitial defects and all the resulting problems associated with such defects.

A second approach to dealing with the problem of agglomerated intrinsic point defects includes methods which focus on the dissolution or annihilation of agglomerated intrinsic point defects subsequent to their formation. Generally, this is achieved by using high temperature heat treatments of the silicon in wafer form. For example, Fusegawa et al. propose, in European Patent Application 503,816 A1, growing the silicon ingot at a growth rate in excess of 0.8 mm/minute, and heat treating the wafers which are sliced from the ingot at a temperature in the range of 1150° C. to 1280° C. to annihilate the defects which form during the crystal growth process. Such heat treatments have been shown to reduce the defect density in a thin region near the wafer surface. The specific treatment needed will vary depending upon the concentration and location of agglomerated intrinsic point defects in the wafer. Different wafers cut from a crystal which does not have a uniform axial concentration of such defects may require different post-growth processing conditions. Furthermore, such wafer heat treatments are relatively costly, have the potential for introducing metallic impurities into the silicon wafers, and are not universally effective for all types of crystal-related defects.

A third approach to dealing with the problem of agglomerated intrinsic point defects is the epitaxial deposition of a thin crystalline layer of silicon on the surface of a single crystal silicon wafer. This process provides a single crystal silicon wafer having a surface which is substantially free of agglomerated intrinsic point defects. Epitaxial deposition, however, substantially increases the cost of the wafer.

In view of these developments, a need continues to exist for a method of single crystal silicon preparation which acts to prevent the formation of agglomerated intrinsic point defects by suppressing the agglomeration reactions which produce them. Rather than simply limiting the rate at which such defects form, or attempting to annihilate some of the defects after they have formed, a method which acts to suppress agglomeration reactions would yield a silicon substrate that is substantially free of agglomerated intrinsic point defects. Such a method would also afford single crystal silicon wafers having epi-like yield potential, in terms of the number of integrated circuits obtained per wafer, without having the high costs associated with an epitaxial process.

SUMMARY OF THE INVENTION

Among the objects of the present invention, therefore, is the provision of single crystal silicon in ingot or wafer form having an axially symmetric region of substantial radial width which is substantially free of defects resulting from an agglomeration of crystal lattice vacancies or silicon self-interstitials; and the provision of a process for preparing a single crystal silicon ingot in which the concentration of vacancies and self-interstitials is controlled in order to prevent an agglomeration of intrinsic point defects in an axially symmetric segment of a constant diameter portion of the ingot, as the ingot cools from the solidification temperature.

Briefly, therefore, the present invention is directed to a single crystal silicon wafer having a central axis, a front side and a back side which are generally perpendicular to the axis, a circumferential edge, and a radius extending from the central axis to the circumferential edge. The wafer comprises an axially symmetric region which is substantially free of agglomerated intrinsic point defects. The axially symmetric region extends radially inwardly from the circumferential edge of the wafer and has a width, as measured from the circumferential edge radially toward the central axis, which is at least about 40% of the length of the radius of the wafer.

The present invention is further directed to a single crystal silicon ingot having a central axis, a seed-cone, an end-cone, and a constant diameter portion between the seed-cone and the end-cone which has a circumferential edge and a radius extending from the central axis to the circumferential edge. The single crystal silicon ingot is characterized in that, after ingot growth is complete and the ingot has cooled from the solidification temperature, the constant diameter portion contains an axially symmetric region which is substantially free of agglomerated intrinsic point defects. The axially symmetric region extends radially inwardly from the circumferential edge and has a width, as measured from the circumferential edge radially toward the central axis, which is at least about 30% of the length of the radius of the constant diameter portion. The axially symmetric region also has a length, as measured along the central axis, of at least about 20% of the length of the constant diameter portion of the ingot.

The present invention is still further directed to a process for growing a single crystal silicon ingot in which an ingot, comprising a central axis, a seed-cone, an end-cone and a constant diameter portion between the seed-cone and the end-cone which has a circumferential edge and a radius extending from the central axis to the circumferential edge, is grown from a silicon melt and then cooled from the solidification temperature in accordance with the Czochralski method. The process comprises controlling a growth velocity, v, and an instantaneous axial temperature gradient, $G_0$, of the crystal during growth of the constant diameter portion to cause the formation of an axially symmetric region which, upon cooling the ingot from the solidification temperature, is substantially free of agglomerated intrinsic point defects. The axially symmetric region extends radially inwardly from the circumferential edge, has a width as measured from the circumferential edge radially toward the central axis which is at least about 30% of the length of the radius of the constant diameter portion, and a length as measured along the central axis of at least about 20% of the length of the constant diameter portion.

Other objects and features of this invention will be in part apparent and in part pointed out hereinafter.

BRIEF DESCRIPTION OF THE DRAWINGS

FIG. 8 is a longitudinal, cross-sectional view of a single crystal silicon ingot showing, in detail, an axially symmetric region of a constant diameter portion of the ingot.

FIG. 9 is a longitudinal, cross-sectional view of a segment of a constant diameter portion of a single crystal silicon ingot, showing in detail axial variations in the width of an axially symmetric region.

DETAILED DESCRIPTION OF THE PREFERRED EMBODIMENTS

Figure 1:
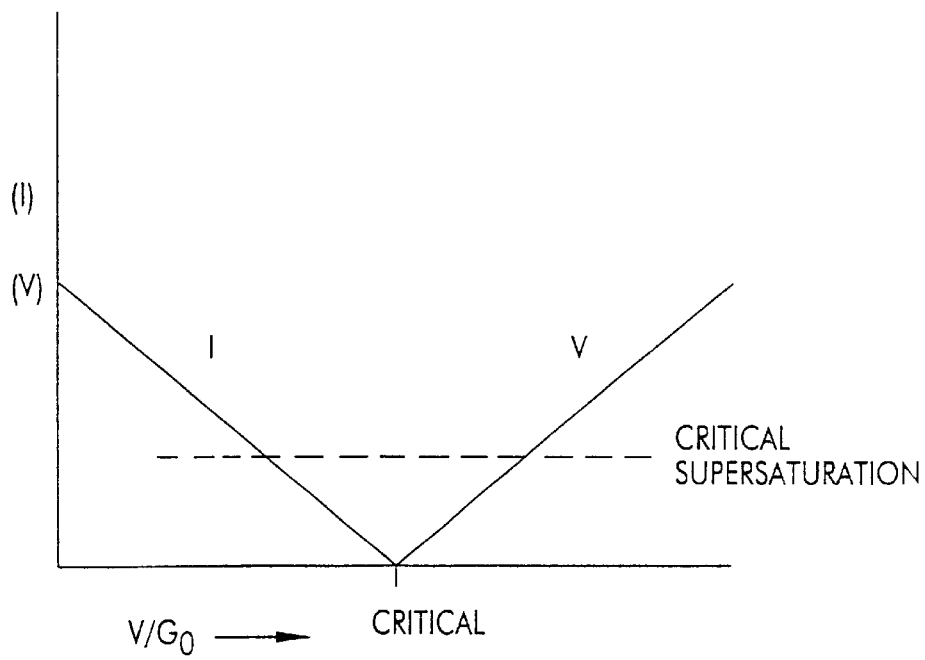
FIG. 1 is a graph which shows an example of how the initial concentration of self-interstitials, [I], and vacancies, [V], changes with an increase in the value of the ratio $v/G_0$, where v is the growth rate and $G_0$ is the instantaneous axial temperature gradient.

As used herein, the following phrases or terms shall have the given meanings: "agglomerated intrinsic point defects" mean defects caused (i) by the reaction in which vacancies agglomerate to produce D-defects, flow pattern defects, gate oxide integrity defects, crystal originated particle defects, crystal originated light point defects, and other such vacancy related defects, or (ii) by the reaction in which self-interstitials agglomerate to produce dislocation loops and networks, and other such self-interstitial related defects; "agglomerated interstitial defects" shall mean agglomerated intrinsic point defects cause, by the reaction in which silicon self-interstitial atoms agglomerate; "agglomerated vacancy defects" shall mean agglomerated vacancy point defects caused by the reaction in which crystal lattice vacancies agglomerate; "radius" means the distance measured from a central axis to a circumferential edge of a wafer or ingot; "substantially free of agglomerated intrinsic point defects" shall mean a concentration of agglomerated defects which is less than the detection limit of these defects, which is currently about $10^4$ defects/cm$^3$; "V/I boundary" means the position along the radius of an ingot or wafer at which the material changes from vacancy dominated to self-interstitial dominated; and "vacancy dominated" and "self-interstitial dominated" mean material in which the intrinsic point defects are predominantly vacancies or self-interstitials, respectively.

In accordance with the present invention, it has been discovered that the reaction in which silicon self-interstitial atoms react to produce agglomerated interstitial defects can be suppressed during the growth of single crystal silicon ingots. Without being bound to any particular theory, it is believed that the concentration of self-interstitials is controlled during the growth and cooling of the crystal ingot in the process of the present invention, such that the change in free energy of the system never exceeds a critical value at which the agglomeration reaction spontaneously occurs to produce agglomerated interstitial defects.

In general, the change in system free energy available to drive the reaction in which agglomerated interstitial defects are formed from silicon self-interstitials in single crystal silicon is governed by Equation (I):

$$\Delta G_2 = kT \ln\left(\frac{[I]}{[I]^{eq}}\right) \quad (I)$$

wherein $\Delta G_I$ is the change in free energy, k is the Boltzmann constant,

T is the temperature in K,

[I] is the concentration of self-interstitials at a point in space and time in the single crystal silicon, and $[I]^{eq}$ is the equilibrium concentration of self-interstitials at the same point in space and time at which [I] occurs and at the temperature, T.

According to this equation, for a given concentration of self-interstitials, [I], a decrease in the temperature, T, generally results in an increase in $\Delta G_I$ due to a sharp decrease in $[I]^{eq}$ with temperature.

Figure 2:
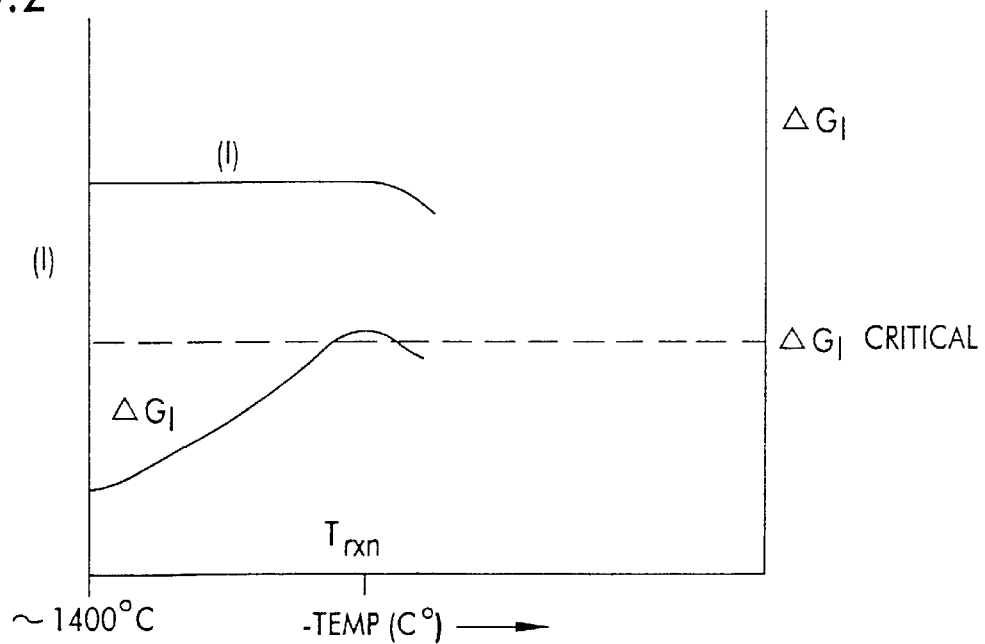
FIG. 2 is a graph which shows an example of how $\Delta G_I$, the change in free energy required for the formation of agglomerated interstitial defects, increases as the temperature, T, decreases, for a given initial concentration of self-interstitials, [I].

FIG. 2 schematically illustrates the change in $\Delta G_I$ and the concentration of silicon self-interstitials for an ingot which is cooled from the temperature of solidification without simultaneously employing some means for suppression of the concentration of silicon self-interstitials. As the ingot cools, $\Delta G_I$ increases according to Equation (I), due to the increasing supersaturation of [I], and the energy barrier for the formation of agglomerated interstitial defects is approached. As cooling continues, this energy barrier is eventually exceeded, at which point a reaction occurs. This reaction results in the formation of agglomerated interstitial defects and the concomitant decrease in $\Delta G_I$ as the supersaturated system is relaxed.

The agglomeration of self-interstitials can be avoided as the ingot cools from the temperature of solidification by maintaining the free energy of the silicon self-interstitial system at a value which is less than that at which an agglomeration reaction will occur. In other words, the system can he controlled so as to never become critically supersaturated. This can be achieved by establishing an initial concentration of self-interstitials which is sufficiently low such that critical supersaturation is never achieved. However, in practice such concentrations are difficult to achieve across an entire crystal radius and, in general, therefore, critical supersaturation may be avoided by suppressing the initial silicon self-interstitial concentration subsequent to crystal solidification.

Figure 3:
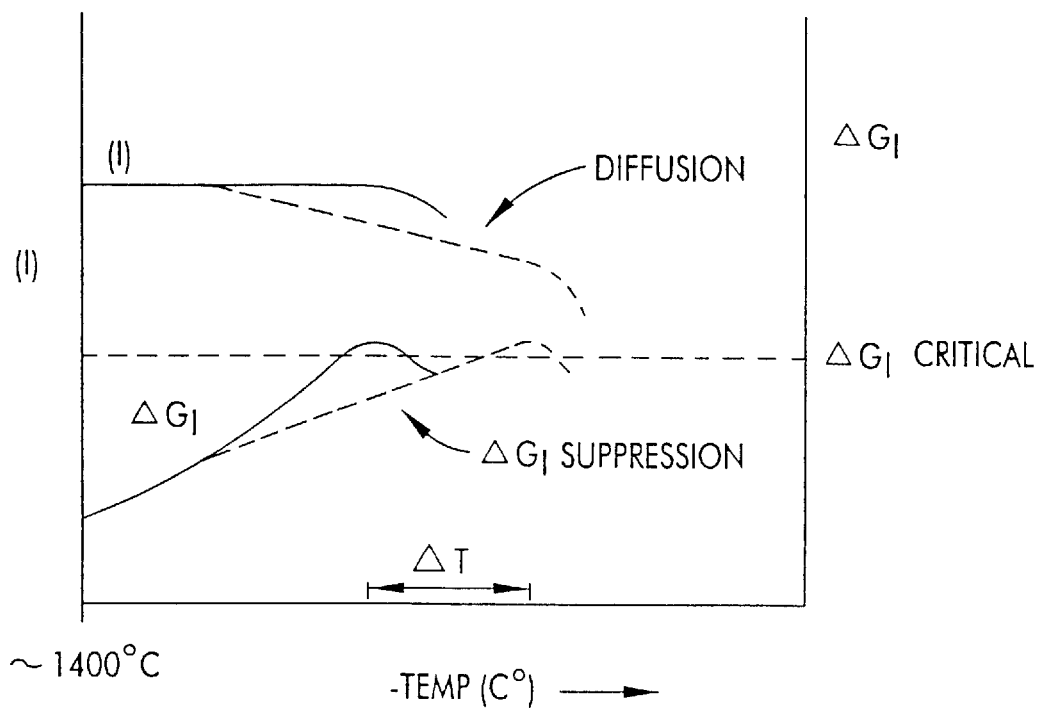
FIG. 3 is a graph which shows an example of how $\Delta G_I$, the change in free energy required for the formation of agglomerated interstitial defects, decreases (as the temperature, T, decreases) as a result of the suppression of the concentration of self-interstitials, [I], through the means of radial diffusion. The solid line depicts the case for no radial diffusion whereas the dotted line includes the effect of diffusion.
Figure 4:
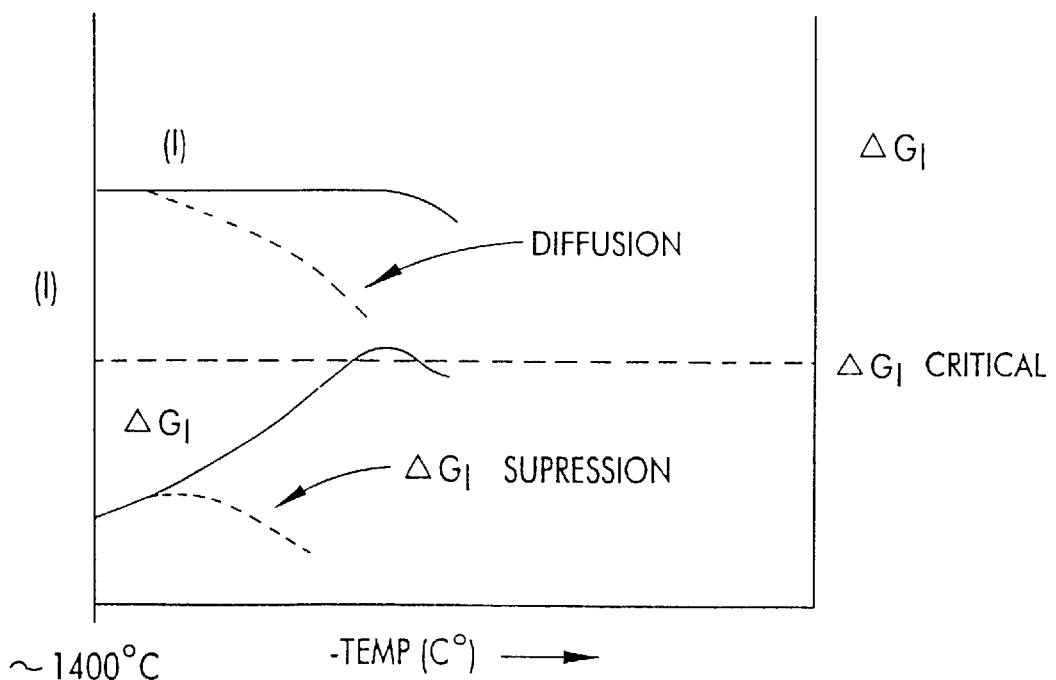
FIG. 4 is a graph which shows an example of how $\Delta G_I$, the change in free energy required for the formation of agglomerated interstitial defects, is sufficiently decreased (as the temperature, T, decreases), as a result of the suppression of the concentration of self-interstitials, [I], through the means of radial diffusion, such that an agglomeration reaction is prevented. The solid line depicts the case for no radial diffusion whereas the dotted line includes the effect of diffusion.

FIGS. 3 and 4 schematically illustrate two possible effects of suppressing [I] upon the increase in $\Delta G_I$ as the ingot of FIG. 2 is cooled from the temperature of solidification. In FIG. 3, the suppression of [I] results in a decrease in the rate of increase of $\Delta G_I$, but in this case, the suppression is insufficient to maintain $\Delta G_I$ everywhere at a value which is less than the critical value at which the reaction occurs; as a result, the suppression merely serves to reduce the temperature at which the reaction occurs. In FIG. 4, an increased suppression of [I] is sufficient to maintain $\Delta G_I$ everywhere to a value which is less than the critical value at which the reaction occurs; the suppression, therefore, inhibits the formation of defects.

Surprisingly, it has been found that due to the relatively large mobility of self-interstitials, it is possible to effect the suppression over relatively large distances by the radial diffusion of self-interstitials to sinks located at the crystal surface or to vacancy dominated regions. Radial diffusion can be effectively used to suppress the concentration of self-interstitials, provided sufficient time is allowed for the radial diffusion of the initial concentration of self-interstitials. In general, the diffusion time will depend upon the radial variation in the initial concentration of self-interstitials, with lesser radial variations requiring shorter diffusion times.

Figure 5:
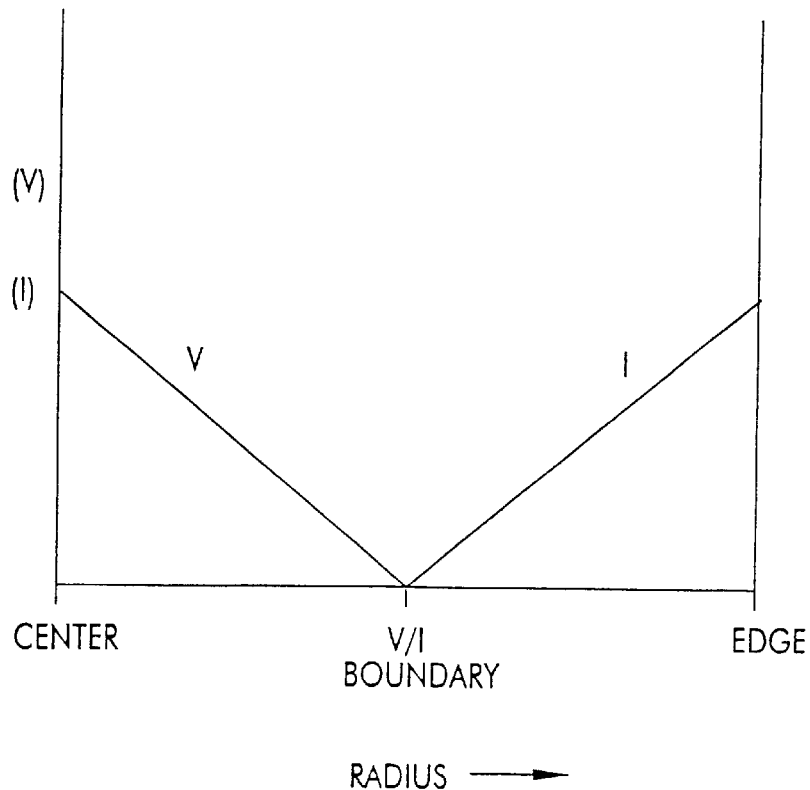
FIG. 5 is a graph which shows an example of how the initial concentration of self-interstitials, [I], and vacancies, [V], can change along the radius of an ingot or wafer, as the value of the ratio $v/G_0$ decreases, due to an increase in the value of $G_0$. Note that at the V/I boundary a transition occurs from vacancy dominated material to self-interstitial dominated material.
Figure 6:
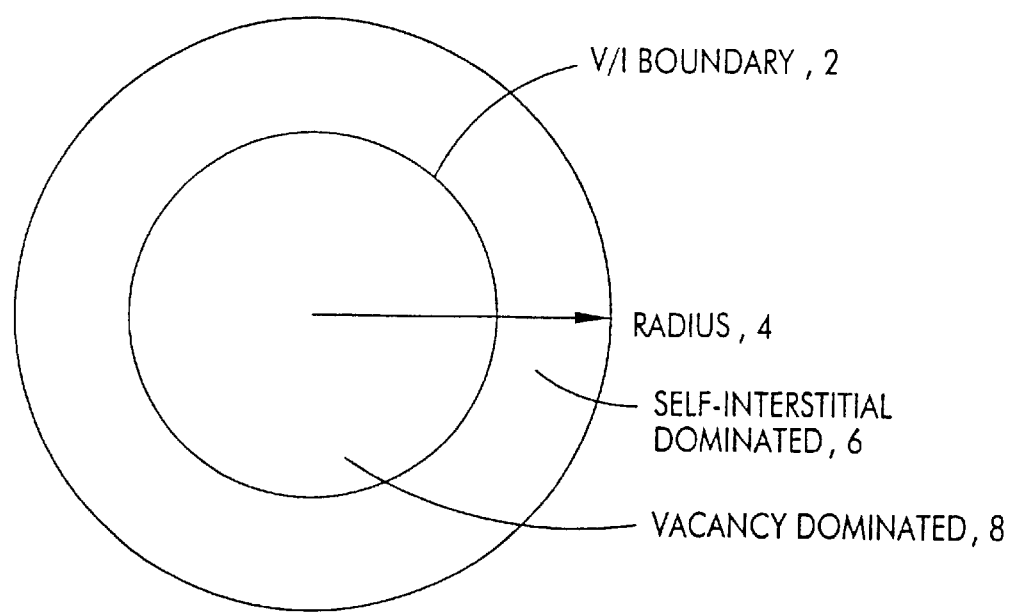
FIG. 6 is a top plan view of a single crystal silicon ingot or wafer showing regions of vacancy, V, and self-interstitial, I, dominated materials respectively, as well as the V/I boundary that exists between them.

Typically, the axial temperature gradient, $G_0$, increases as a function of increasing radius for single crystal silicon which is grown according to the Czochralski method. This means that the value of $v/G_0$ is typically not singular across the radius of an ingot. As a result of this variation, the type and initial concentration of intrinsic point defects is not constant. If the critical value of $v/G_0$, denoted in FIGS. 5 and 6 as the V/I boundary 2, is reached at some point along the radius 4, the material will switch from being vacancy dominated to self-interstitial dominated. In addition, the ingot will contain an axially symmetric region of self-interstitial dominated material 6 (in which the initial concentration of silicon self-interstitial atoms increases as a function of increasing radius), surrounding a generally cylindrical region of vacancy dominated material 8 (in which the initial concentration of vacancies decreases as a function of increasing radius).

Figure 7A:
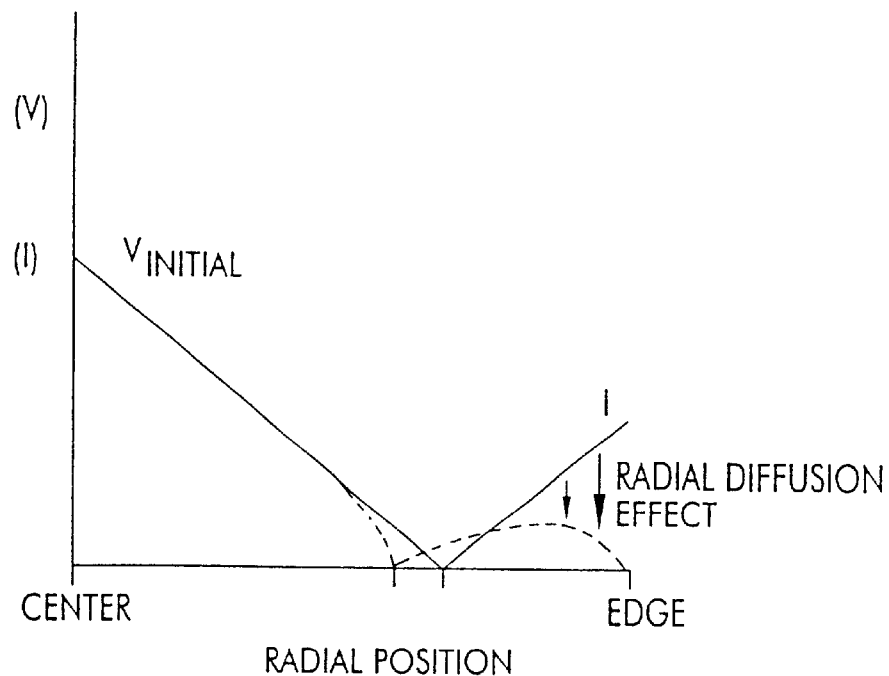
FIG. 7a is a graph which shows an example of how the initial concentration of vacancies or self-interstitials changes as a function of radial position due to radial diffusion of self-interstitials. Also shown is how such diffusion causes the location of the V/I boundary to move closer to the center of the ingot (as a result of the recombination of vacancies and self-interstitials), as well as the concentration of self-interstitials, [I], to be suppressed.
Figure 7B:
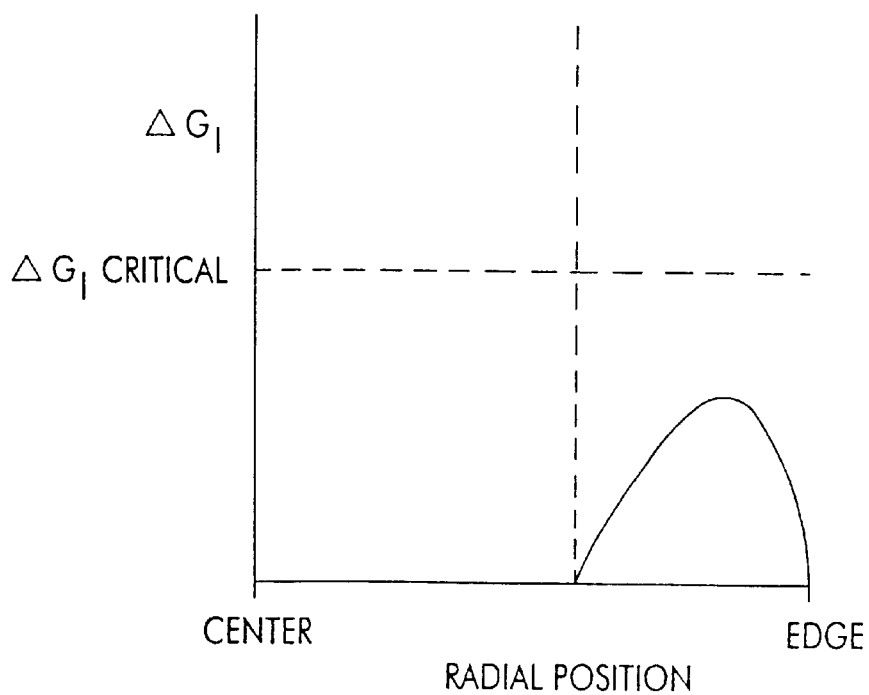
FIG. 7b is a graph of $\Delta G_I$ as a function of radial position which shows an example of how the suppression of self-interstitial concentration, [I], (as depicted in FIG. 7a) is sufficient to maintain $\Delta G_I$ everywhere to a value which is less than the critical value at which the silicon self-interstitial reaction occurs.

FIGS. 7a and 7b schematically illustrate the effect of suppressing [I] upon the increase in $\Delta G_I$ as an ingot is cooled from the temperature of solidification in accordance with one embodiment of the present invention. When the ingot is pulled in accordance with the Czochralski method, the ingot contains an axially symmetric region of interstitial dominated material extending from the edge of the ingot to the position along the radius at which the V/I boundary occurs and a generally cylindrical region of vacancy dominated material extending from the center of the ingot to the position along the radius at which the V/I boundary occurs. As the ingot is cooled from the temperature of solidification, radial diffusion of interstitial atoms causes a radially inward shift in the V/I boundary due to a recombination of self-interstitials with vacancies and a significant suppression of the self-interstitial concentration outsize the V/I boundary. Furthermore, the suppression of [I] is sufficient to maintain $\Delta G_I$ everywhere to a value which is less than the critical value at which the silicon self-interstitial reaction occurs.

Referring now to FIGS. 8 and 9, in the process of the present invention a single crystal silicon ingot 10 is grown in accordance with the Czochralski method. The silicon ingot comprises a central axis 12, a seed-cone 14, an end-cone 16 and a constant diameter portion 18 between the seed-cone and the end-cone. The constant diameter portion has a circumferential edge 20 and a radius 4 extending from the central axis to the circumferential edge. The process comprises controlling the growth velocity, v, and the instantaneous axial temperature gradient, $G_0$, of the crystal during the growth of the constant diameter portion of the ingot to cause the formation of an axially symmetric region 6 which, upon cooling the ingot from the solidification temperature, is substantially free of agglomerated intrinsic point defects.

The growth conditions are preferably controlled to maintain the V/I boundary 2 at a position which maximizes the volume of the axially symmetric region 6 relative to the volume of the constant diameter portion 18 of the ingot 10. In general, therefore, it is preferred that the axially symmetric region have a width 22 (as measured from the circumferential edge radially toward the central axis of the ingot) and a length 24 (as measured along the central axis of the ingot) which equals the radius 4 and length 26, respectively of the constant diameter portion of the ingot. As a practical matter, however, operating conditions and crystal puller hardware constraints may dictate that the axially symmetric region occupy a lesser proportion of the constant diameter portion of the ingot. In general, therefore, the axially symmetric region preferably has a width of at least about 30%, more preferably at least about 40%, still more preferably at least about 60%, and most preferably at least about 80% of the radius of the constant diameter portion of the ingot. In addition, the axially symmetric region extends over a length of at least about 20%, preferably at least about 40%, more preferably at least about 60%, and still more preferably at least about 80% of the length of the constant diameter portion of the ingot.

Referring to FIG. 9, the width 22 of the axially symmetric region 6 may have some variation along the length of the central axis 12. For an axially symmetric region of a given length, therefore, the width is determined by measuring the distance from the circumferential edge 20 of the ingot 10 radially toward a point which is farthest from the central axis. In other words, the width 22 is measured such that the minimum distance within the given length 24 of the axially symmetric region 6 is determined.

Figure 10:
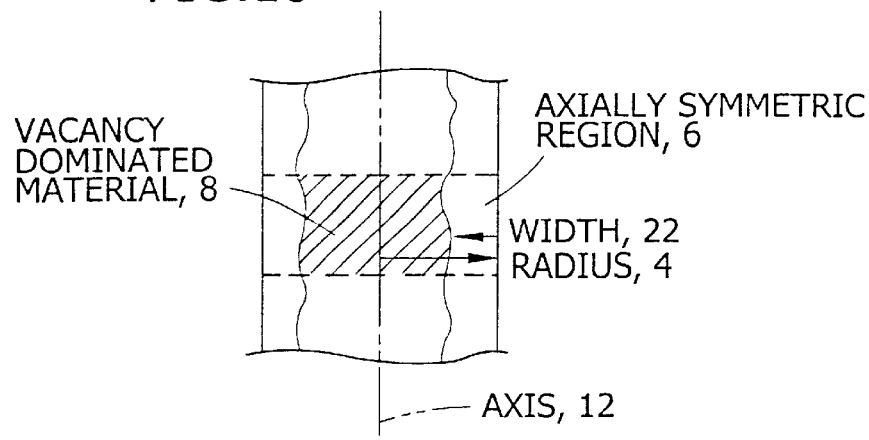
FIG. 10 is a longitudinal, cross-sectional view of a segment of a constant diameter portion of a single crystal silicon ingot having axially symmetric region of a width which is less than the radius of the ingot, showing in detail that this region further contains a generally cylindrical region of vacancy dominated material.
Figure 11:
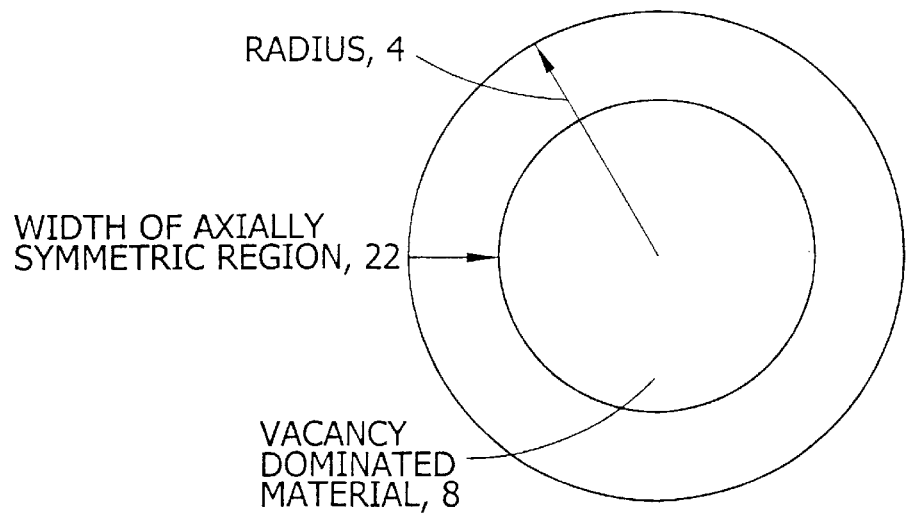
FIG. 11 is a latitudinal, cross-sectional view of the axially symmetric region depicted in FIG. 10.
Figure 12:
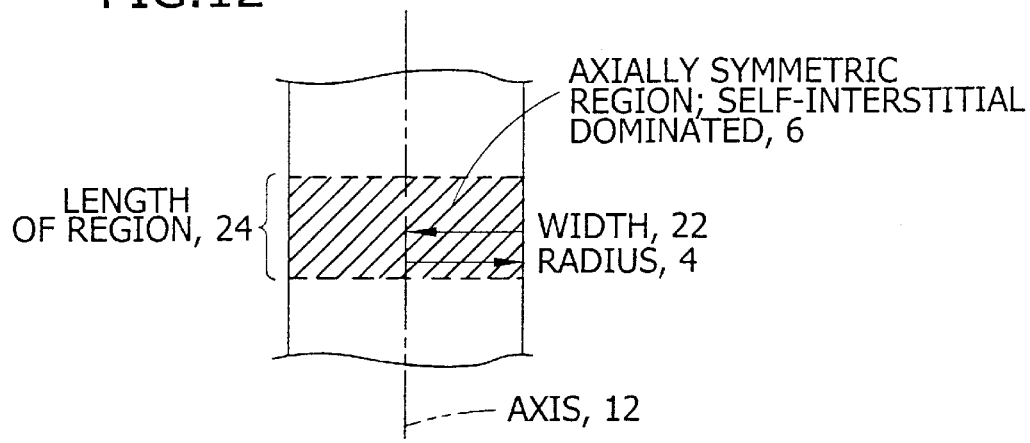
FIG. 12 is a longitudinal, cross-sectional view of a segment of a constant diameter portion of a single crystal silicon ingot having an axially symmetric region of a width which is equal to the radius of the ingot, showing in detail that this region is a generally cylindrical region of self-interstitial dominated material which is substantially free of agglomerated intrinsic point defects.

Referring now to FIGS. 10 and 11, when the axially symmetric region 6 of the constant diameter portion 18 of the ingot 10 has a width 22 which is less than the radius 4 of the constant diameter portion, the region is generally annular in shape. A generally cylindrical region of vacancy dominated material 8, which is centered about the central axis 12, is located radially inward of the generally annular shaper segment. Referring to FIG. 12, it is to be understood that when the width 22 of the axially symmetric region 6 is equal to the radius 4 of the constant diameter portion 18, the region does not contain this vacancy dominated region; rather, the axially symmetric region itself is generally cylindrical and contains self-interstitial dominated material which is substantially free of agglomerated intrinsic point defects.

While it is generally preferred that the crystal growth conditions be controlled to maximize the width of the interstitial dominated region, there may be limits for a given crystal puller hot zone design. As the V/I boundary is moved closer to the central crystal axis, provided the cooling conditions and $G_0(r)$ do not change, where $G_0(r)$ is the radial variation of $G_0$, the minimum amount of radial diffusion required increases. In these circumstances, there may be a minimum radius of the vacancy dominated region which is required to suppress the formation of agglomerated interstitial defects by radial diffusion.

Figure 7C:
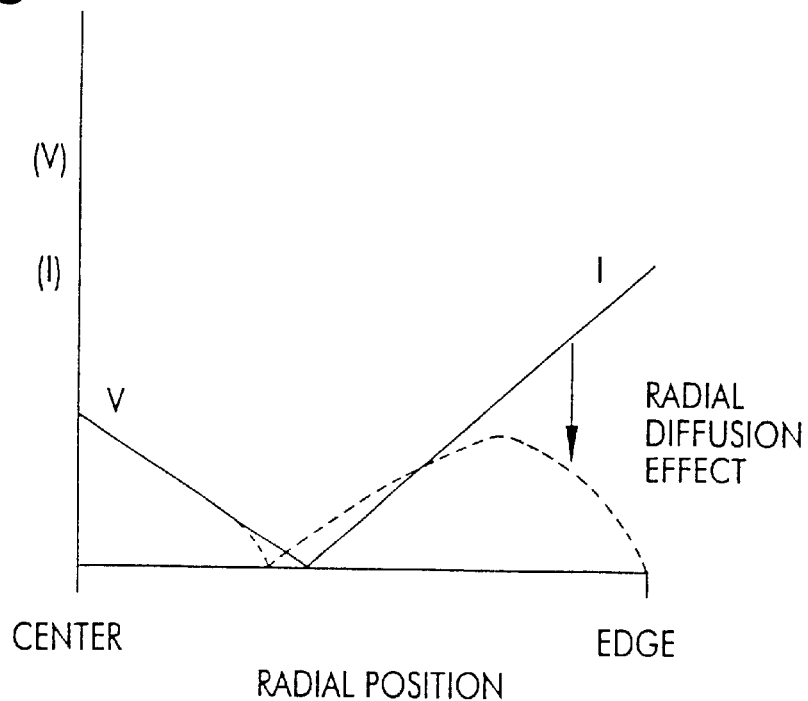
FIG. 7c is a graph which shows another example of how the initial concentration of vacancies or self-interstitials changes as a function of radial position due to radial diffusion of self-interstitials. Note that, in comparison to FIG. 7a, such diffusion caused the location of the V/I boundary to be closer to the center of the ingot (as a result of the recombination of vacancies and self-interstitials), resulting in an increase in the concentration of interstitials in the region outside of the V/I boundary.
Figure 7D:
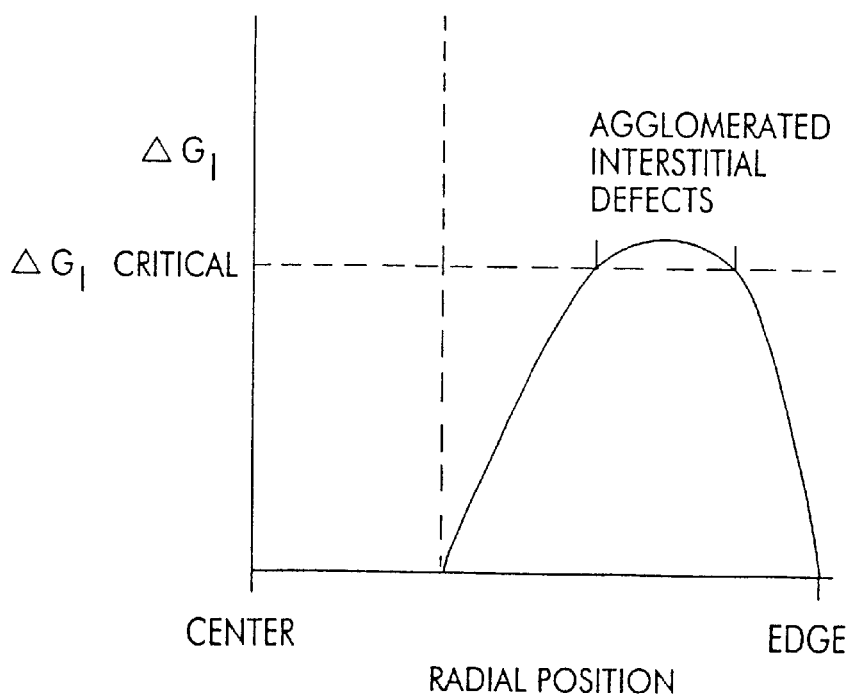
FIG. 7d is a graph of $\Delta G_I$ as a function of radial position which shows an example of how the suppression of self-interstitial concentration, [I], (as depicted in FIG. 7c) is not sufficient to maintain $\Delta G_I$ everywhere to a value which is less than the critical value at which the silicon self-interstitial reaction occurs.
Figure 7E:
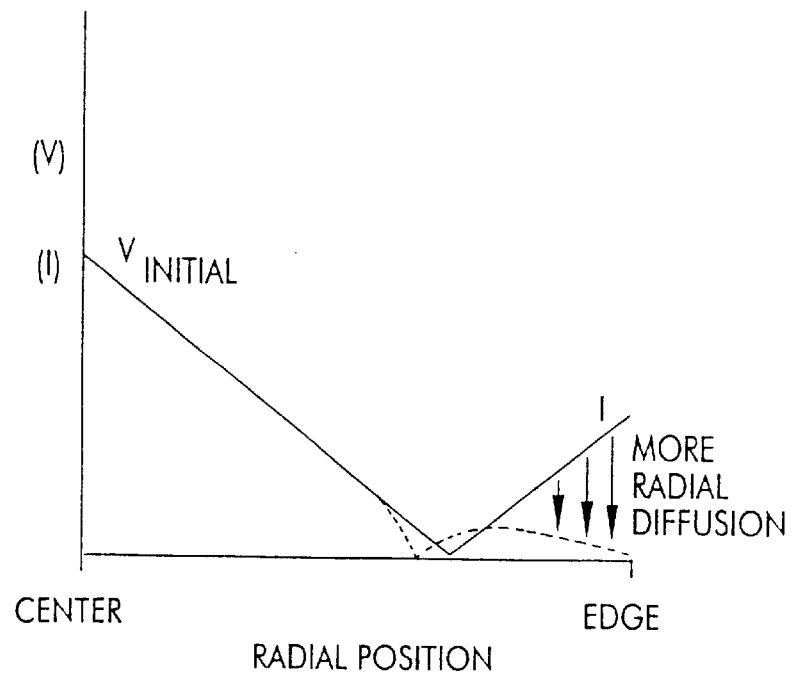
FIG. 7e is a graph which shows another example of how the initial concentration of vacancies or self-interstitials changes as a function of radial position due to radial diffusion of self-interstitials. Note that, in comparison to FIG. 7a, increased diffusion resulted in greater suppression the self-interstitial concentration.
Figure 7F:
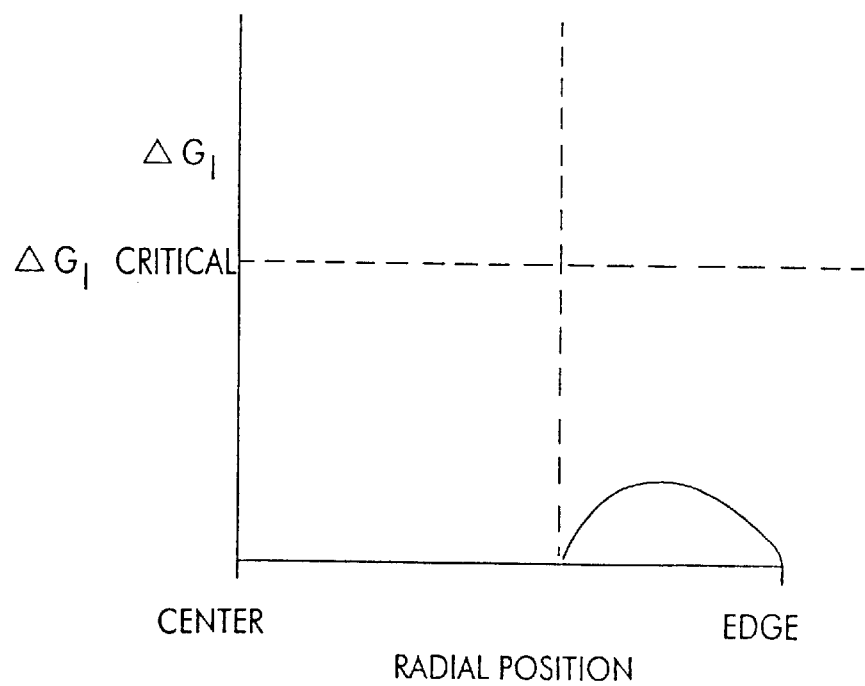
FIG. 7f is a graph of $\Delta G_I$ as a function of radial position which shows an example of how greater suppression of the self-interstitial concentration, [I], (as depicted in FIG. 7e) results in a greater degree of suppression in $\Delta G_I$, as compared to FIG. 7b.
Figure 7G:
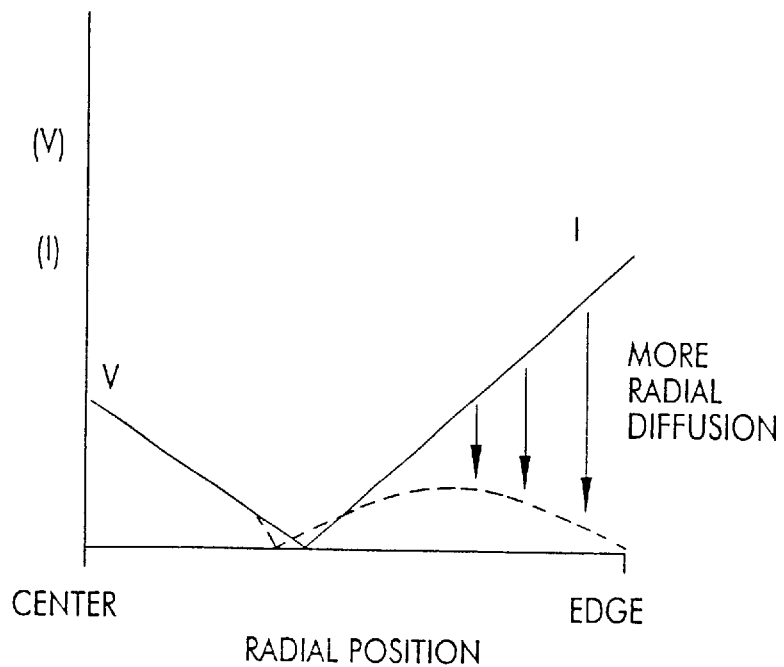
FIG. 7g is a graph which shows another example of how the initial concentration of vacancies or self-interstitials changes as a function of radial position due to radial diffusion of self-interstitials. Note that, in comparison to FIG. 7c, increased diffusion resulted in greater suppression the self-interstitial concentration.
Figure 7H:
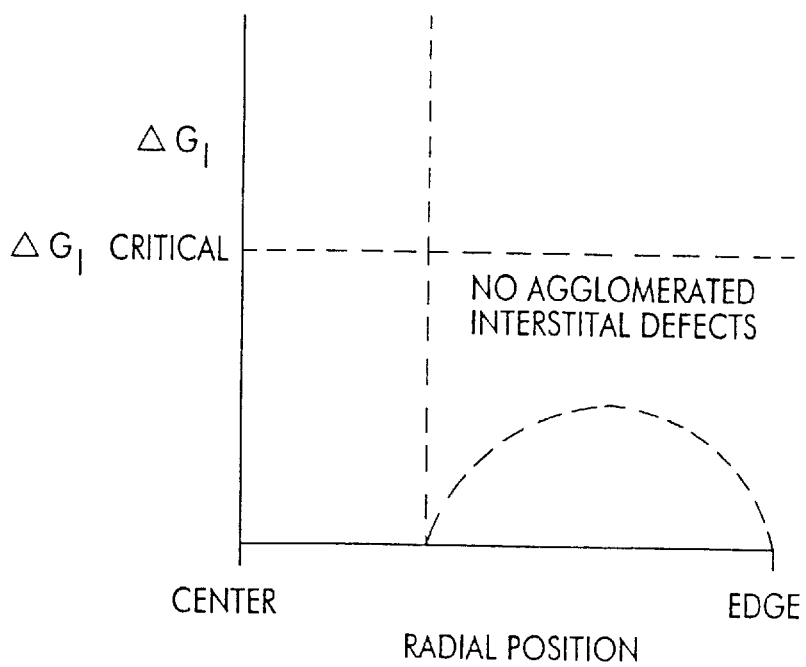
FIG. 7h is a graph of $\Delta G_I$ as a function of radial position which shows an example of how greater suppression of the self-interstitial concentration, [I], (as depicted in FIG. 7g) results in a greater degree of suppression in $\Delta G_I$, as compared to FIG. 7d.

FIGS. 7c and 7d schematically illustrate an example in which the minimum radius of the vacancy dominated region is exceeded. In this example, the cooling conditions and $G_0(r)$ are the same as those employed for the crystal of FIGS. 7a and 7b in which there was sufficient outdiffusion to avoid agglomerated interstitial defects for the position of the V/I boundary illustrated. In FIGS. 7c and 7d, the position of the V/I boundary is moved closer to the central axis (relative to FIGS. 7a and 7b) resulting in an increase in the concentration of interstitials in the region outside of the V/I boundary. As a result, more radial diffusion is required to sufficiently suppress the interstitial concentration. If sufficient outdiffusion is not achieved, the system $\Delta G_I$ will increase beyond the critical value and the reaction which produces agglomerated interstitial defects will occur, producing a region of these defects in an annular region between the V/I boundary and the edge of the crystal. The radius of the V/I boundary at which this occurs is the minimum radius for the given hot zone. This minimum radius is decreased if more radial diffusion of interstitials is allowed.

FIGS. 7e, 7f, 7g and 7h illustrate the effect of an increased radial outdiffusion on interstitial concentration profiles and the rise of system $\Delta G_I$ for a crystal grown with the same initial vacancy and interstitial concentration profiles as the crystal exemplified in FIGS. 7a, 7b, 7c and 7d. Increased radial diffusion of interstitials results in a greater suppression of interstitial concentration, thus suppressing the rise in the system $\Delta G_I$ to a greater degree than in FIGS. 7a, 7b, 7c and 7d. In this case the system $\Delta G_I$ is not exceeded for the smaller radius of the V/I boundary.

Figure 7I:
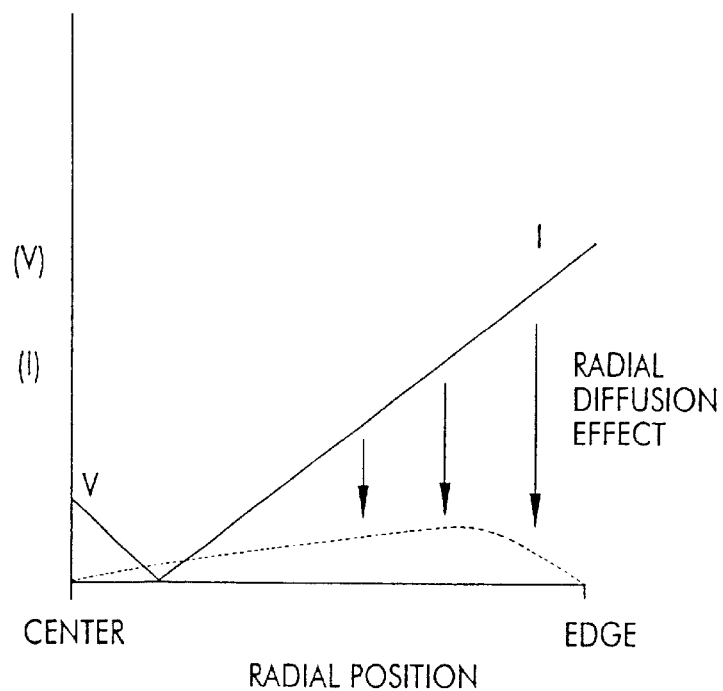
FIG. 7i is a graph which shows another example of how the initial concentration of vacancies or self-interstitials changes as a function of radial position due to radial diffusion of self-interstitials. Note that in this example a sufficient quantity of self-interstitials recombine with vacancies, such that there is no longer a vacancy-dominated region.
Figure 7J:
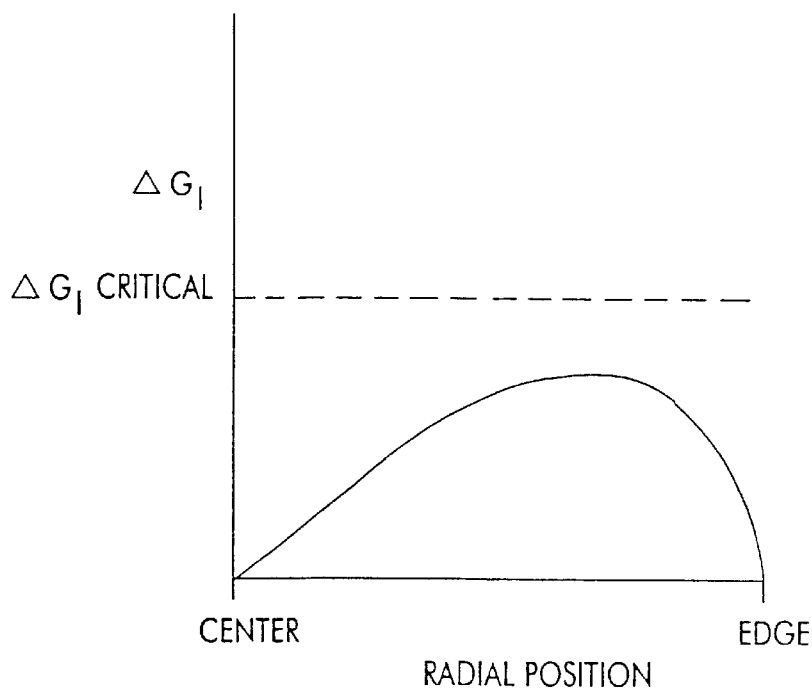
FIG. 7j is a graph of $\Delta G_I$ as a function of radial position which shows an example of how radial diffusion of self-interstitials (as depicted in FIG. 7i) is sufficient to maintain a suppression of agglomerated interstitial defects everywhere along the crystal radius.

FIGS. 7i and 7j illustrate an example in which sufficient radial diffusion is allowed such that the minimum radius is reduced to zero by insuring sufficient radial diffusion to achieve a suppression of agglomerated interstitial defects everywhere along the crystal radius.

In a preferred embodiment of the process of the present invention, the initial concentration of silicon self-interstitial atoms is controlled in the axially symmetric, self-interstitial dominated region of the ingot. Referring again to FIG. 1, in general, the initial concentration or silicon self-interstitial atoms is controlled by controlling the crystal growth velocity, v, and the instantaneous axial temperature gradient, $G_0$, such that the value of the ratio $v/G_0$ is relatively near the critical value of this ratio, at which the V/I boundary occurs. In addition, the instantaneous axial temperature gradient, $G_0$, can be established such that the variation of $G_0$ (and thus, $v/G_0$) as a function of the ingot radius is also controlled.

The growth velocity, v, and the instantaneous axial temperature gradient, $G_0$, are typically controlled such that the ratio $v/G_0$ ranges in value from about 0.5 to about 2.5 times the critical value of $v/G_0$ (i.e., about $1 \times 10^{-5}$ cm$^2$/sK to about $5 \times 10^{-5}$ cm$^2$/sK based upon currently available information for the critical value of $v/G_0$). Preferably, the ratio $v/G_0$ will range in value from about 0.6 to about 1.5 times the critical value of $v/G_0$ (i.e., about $1.3 \times 10^{-5}$ cm$^2$/sK to about $3 \times 10^{-5}$ cm$^2$/sK based upon currently available information for the critical value of $v/G_0$). Most preferably, the ratio $v/G_0$ will range in value from about 0.75 to about 1 times the critical value of $v/G_0$ (i.e., about $1.6 \times 10^{-5}$ cm$^2$/sK to about $2.1 \times 10^{-5}$ cm$^2$/sK based upon currently available information for the critical value of $v/G_0$). These ratios are achieved by independent control of the growth velocity, v, and the instantaneous axial temperature gradient, $G_0$.

In general, control of the instantaneous axial temperature gradient, $G_0$, may be achieved primarily through the design of the "hot zone" of the crystal puller, i.e. the graphite (or other materials) that makes up the heater, insulation, and heat shields, among other things. Although the design particulars may vary depending upon the make and model of the crystal puller, in general, $G_0$ may be controlled using any of the means currently known in the art for minimizing axial variations in heat transfer at the melt/solid interface, including reflectors, radiation shields, purge tubes, light pipes, and heaters. In general, radial variations in $G_0$ are minimized by positioning such an apparatus within about one crystal diameter above the melt/solid interface. $G_0$ can be controlled further by adjusting the position of the apparatus relative to the melt and crystal. This is accomplished either by adjusting the position of the apparatus in the hot zone, or by adjusting the position of the melt surface in the hot zone. Either, or both, of these methods can be used during a batch Czochralski process in which melt volume is depleted during the process.

It is generally preferred for some embodiments of the present invention that the instantaneous axial temperature gradient, $G_0$, be relatively constant as a function of diameter of the ingot. However, it should be noted that as improvements in hot zone design allow for variations in $G_0$ to be minimized, mechanical issues associated with maintaining a constant growth rate become an increasingly important factor. This is because the growth process becomes much more sensitive to any variation in the pull rate, which in turn directly effects the growth rate, v. In terms of process control, this means that it is favorable to have values for $G_0$ which differ over the radius of the ingot. Significant differences in the value of $G_0$, however, can result in a large concentration of self-interstitials near the wafer edge and, thereby, increase the difficultly in avoiding the formation of agglomerated intrinsic point defects.

In view of the foregoing, the control of $G_0$ involves a balance between minimizing radial variations in $G_0$ and maintaining favorable process control conditions. Typically, therefore, the pull rate after about one diameter of the crystal length will range from about 0.2 mm/minute to about 0.8 mm/minute. Preferably, the pull rate will range from about 0.25 mm/minute to about 0.6 mm/minute and, most preferably, from about 0.3 mm/minute to about 0.5 mm/minute. It is to be noted the stated ranges are typical for 200 mm diameter crystals. However, the pull rate is dependent upon both the crystal diameter and crystal puller design. In general, the pull rate will decrease as the crystal diameter increases.

The amount of self-interstitial diffusion may be controlled by controlling the cooling rate as the ingot is cooled from the solidification temperature (about 1410° C.) to the temperature at which silicon self-interstitials become immobile, for commercially practical purposes. Silicon self-interstitials appear to be extremely mobile at temperatures near the solidification temperature of silicon, i.e. about 1410° C. This mobility, however, decreases as the temperature of the single crystal silicon ingot decreases. Experimental evidence obtained to-date suggests that the diffusion rate of self-interstitials slows such a considerable degree that they are essentially immobile for commercially practical time periods at temperatures less than about 700° C., and perhaps at temperatures as great as 800° C., 900° C., or even 1,000° C.

Within the range of temperatures at which self-interstitials appear to be mobile, and depending upon the temperature in the hot zone, the cooling rate will typically range from about 0.2° C./minute to about 2° C./minute. Preferably, the cooling rate will range from about 0.2° C./minute to about 1.5° C./minute and, more preferably, from about 0.2° C./minute to about 1° C./minute. Control of the cooling rate can be achieved by using any means currently known in the art for minimizing heat transfer, including the use of insulators, heaters, and radiation shields.

As previously noted, a minimum radius of the vacancy dominated region exists for which the suppression of agglomerated interstitial defects may be achieved. The value of the minimum radius depends on $v/G_0(r)$ and the cooling rate. As crystal puller and hot zone designs will vary, the ranges presented above for $v/G_0(r)$, pull rate, and cooling rate will also vary. Likewise these conditions may vary along the length of a growing crystal. Also as noted above, the width of the interstitial dominated region free of agglomerated interstitial defects is preferably maximized. Thus, it is desirable to maintain the width of this region to a value which is as close as possible to, without exceeding, the difference between the crystal radius and the minimum radius of the vacancy dominated region along the length of the growing crystal in a given crystal puller.

The optimum width of the axially symmetric region and the required optimal crystal pulling rate profile for a given crystal puller hot zone design may be determined empirically. Generally speaking, this empirical approach involves first obtaining readily available data on the axial temperature profile for an ingot grown in a particular crystal puller, as well as the radial variations in the instantaneous axial temperature gradient for an ingot grown in the same puller. Collectively, this data is used to pull one or more single crystal silicon ingots, which are then analyzed for the presence of agglomerated interstitial defects. In this way, an optimum pull rate profile can be determined.

Figure 13:
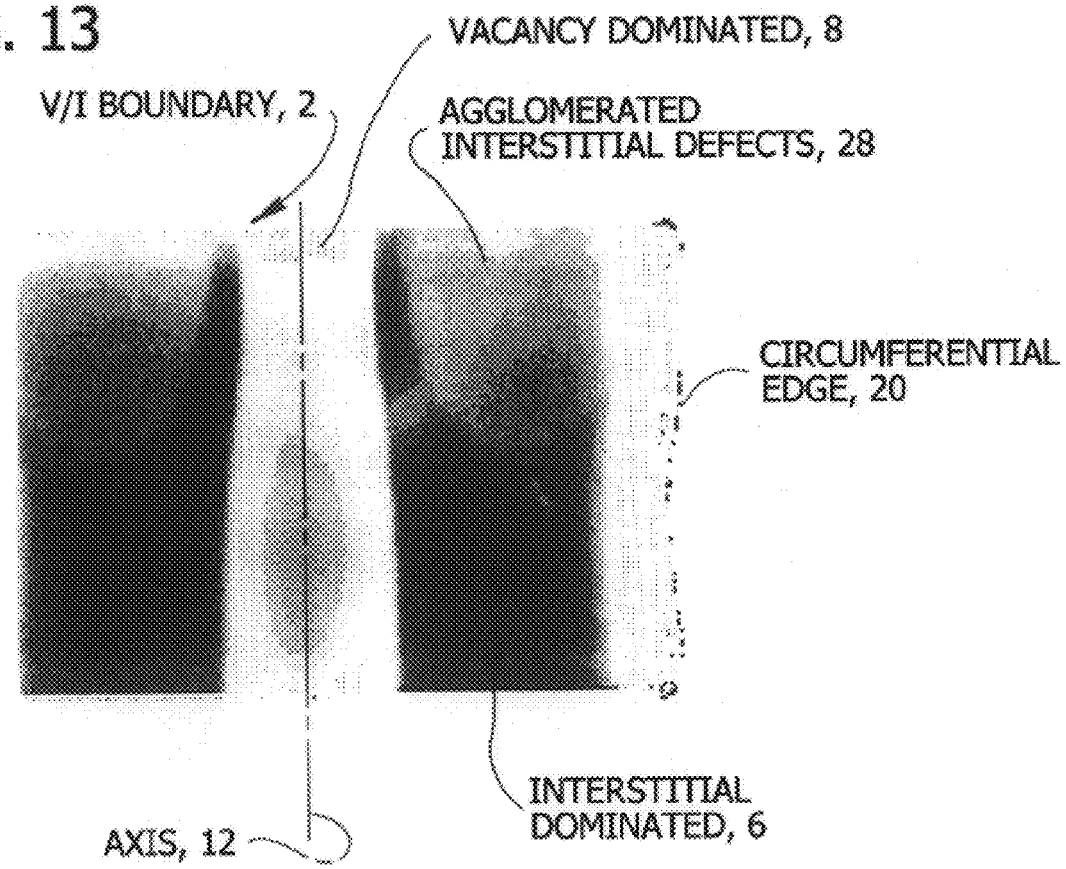
FIG. 13 is an image produced by a scan of the minority carrier lifetime of an axial cut of the ingot following a series of oxygen precipitation heat treatments, showing in detail a generally cylindrical region of vacancy dominated material, a generally annular shaped axially symmetric region of self-interstitial dominated material, the V/I boundary present between them, and a region of agglomerated interstitial defects.

FIG. 13 is an image produced by a scan of the minority carrier lifetime of an axial cut of a section of a 200 mm diameter ingot following a series of oxygen precipitation heat-treatments which reveal defect distribution patterns. It depicts an example in which a near-optimum pull rate profile is employed for a given crystal puller hot zone design. In this example, a transition occurs from the optimum $v/G_0(r)$ at which the axially symmetric region has the maximum width, to a $v/G_0(r)$ in which the maximum width of the interstitial dominated region is exceeded, resulting in the generation of regions of agglomerated interstitial defects 28.

In addition to the radial variations in $v/G_0$ resulting from an increase in $G_0$ over the radius of the ingot, $v/G_0$ may also vary axially as a result of a change in v, or as a result of natural variations in $G_0$ due to the Czochralski process. For a standard Czochralski process, v is altered as the pull rate is adjusted throughout the growth cycle, in order to maintain the ingot at a constant diameter. These adjustments, or changes, in the pull rate in turn cause $v/G_0$ to vary over the length of the constant diameter portion of the ingot. In accordance with the process of the present invention, the pull rate is therefore controlled in order to maximize the width of the axially symmetric region of the ingot. As a result, however, variations in the radius of the ingot may occur. In order to ensure that the resulting ingot has a constant diameter, the ingot is therefore preferably grown to a diameter larger than that which is desired. The ingot is then subjected to processes standard in the art to remove excess material from the surface, thus ensuring that an ingot having a constant diameter portion is obtained.

For an ingot prepared in accordance with the process of the present invention and having a V/I boundary, experience has shown that low oxygen content material, i.e., less than about 13 PPMA (parts per million atomic, ASTM standard F-121-83), is preferred. More preferably, the single crystal silicon contains less than about 12 PPMA oxygen, still more preferably less than about 11 PPMA oxygen, and most preferably less than about 10 PPMA oxygen. This is because, in medium to high oxygen contents wafers, i.e., 14 PPMA to 18 PPMA, the formation of oxygen-induced stacking faults and bands of enhanced oxygen clustering just inside the V/I boundary becomes more pronounced. Each of these are a potential source for problems in a given integrated circuit fabrication process.

The effects of enhanced oxygen clustering may be further reduced by two methods, used singularly or in combination. Oxygen precipitate nucleation centers typically form in silicon which is annealed at a temperature in the range of about 350° to about 750° C. For some applications, therefore, it may be preferred that the crystal be a "short" crystal, that is, a crystal which has been grown in a Czochralski process until the seed end has cooled from the melting point of silicon (1410° C.) to about 750° C. after which the ingot is rapidly cooled. In this way, the time spent in the temperature range critical for nucleation center formation is kept to a minimum and the oxygen precipitate nucleation centers have inadequate time to form in the crystal puller.

Alternatively, and more preferably, oxygen precipitate nucleation centers formed during the growth of the single crystal are dissolved by annealing the single crystal silicon. Provided they have not been subjected to a stabilizing heat-treatment, oxygen precipitate nucleation centers can be annealed out of silicon by rapidly heating the silicon to a temperature of at least about 875° C. and preferably continuing to increase the temperature to at least 1000° C. By the time the silicon reaches 1000° C., substantially all (e.g., >99%) of such defects have annealed out. It is important that the wafers be rapidly heated to these temperatures, i.e., that the rate of temperature increase be at least about 10° C. per minute and more preferably at least about 50° C. per minute. Otherwise, some or all of the oxygen precipitate nucleation centers may be stabilized by the heat-treatment. Equilibrium appears to be reached in relatively short periods of time, i.e., on the order of 1 minute. Accordingly, oxygen precipitate nucleation centers in the single crystal silicon may be dissolved by annealing it at a temperature of at least about 875° C. for a period of at least about 30 seconds, preferably at least abut 10 minutes. The dissolution may be carried out in a conventional furnace or in a rapid thermal annealing (RTA) system. In addition, the dissolution may carried out on crystal ingots or on wafers, preferably wafers.

Although the temperature at which a self-interstitial agglomeration reaction occurs may in theory vary over a wide range of temperatures, as a practical matter this range appears to be relatively narrow for conventional, Czochralski grown silicon. This is a consequence of the relatively narrow range of initial self-interstitial concentrations which are typically obtained in silicon grown according to the Czochralski method. In general, therefore, a self-interstitial agglomeration reaction will typically occur, if at all, at temperatures within the range of about 1100° C. to about 800° C.

As the Examples given below illustrate, the present invention affords a process for preparing a single crystal silicon ingot in which, as the ingot cools from the solidification temperature in accordance with the Czochralski method, the agglomeration of intrinsic point defects is prevented within an axially symmetric region of the constant diameter portion of the ingot, from which wafers may be sliced.

The following Examples set forth one set of conditions that may be used to achieve the desired result. Alternative approaches exist for determining an optimum pull rate profile for a given crystal puller. For example, rather than growing a series of ingots at various pull rates, a single crystal could be grown at pull rates which increase and decrease along the length of the crystal; in this approach, agglomerated self-interstitial defects would be caused to appear and disappear multiple times during growth of a single crystal. Optimal pull rates could then be determined for a number of different crystal positions. Accordingly, the following Examples should not be interpreted in a limiting sense.

EXAMPLE 1

Figure 14:
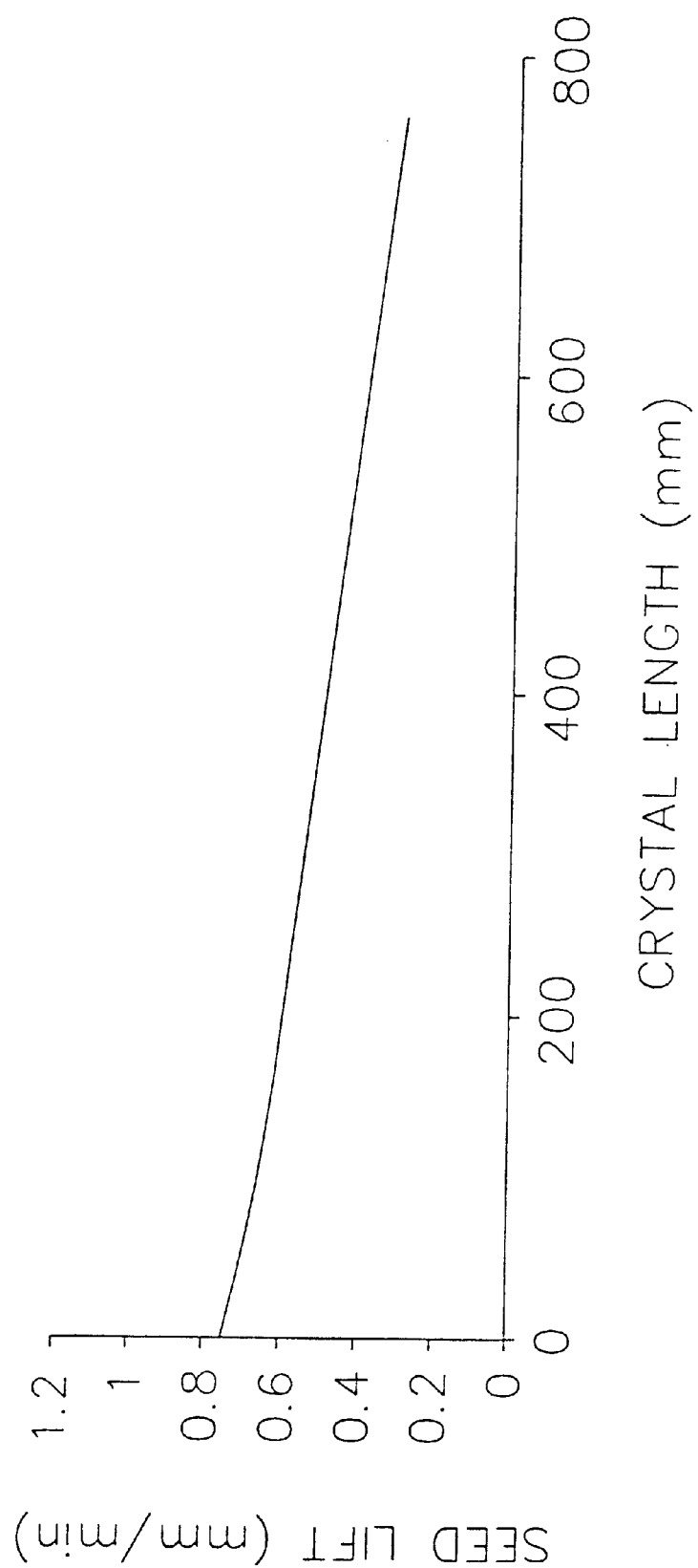
FIG. 14 is a graph of pull rate (i.e. seed lift) as a function of crystal length, showing how the pull rate is decreased linearly over a portion of the length of the crystal.

Optimization Procedure For A Crystal Puller Having A Pre-existing Hot Zone Design A first 200 mm single crystal silicon ingot was grown under conditions in which the pull rate was ramped linearly from 0.75 mm/min. to 0.35 mm/min. over the length of the crystal. FIG. 14 shows the pull rate as a function of crystal length. Taking into account the pre-established axial temperature profile of a growing 200 mm ingot in the crystal puller and the pre-established radial variations in the instantaneous axial temperature gradient, $G_0$, i.e., the axial temperature gradient at the melt/solid interface, these pull rates were selected to insure that ingot would be vacancy dominated material from the center to the edge at one end of the ingot and interstitial dominated material from the center to the edge of the other end of the ingot. The grown ingot was sliced longitudinally and analyzed to determine where the formation of agglomerated interstitial defects begins.

Figure 15:
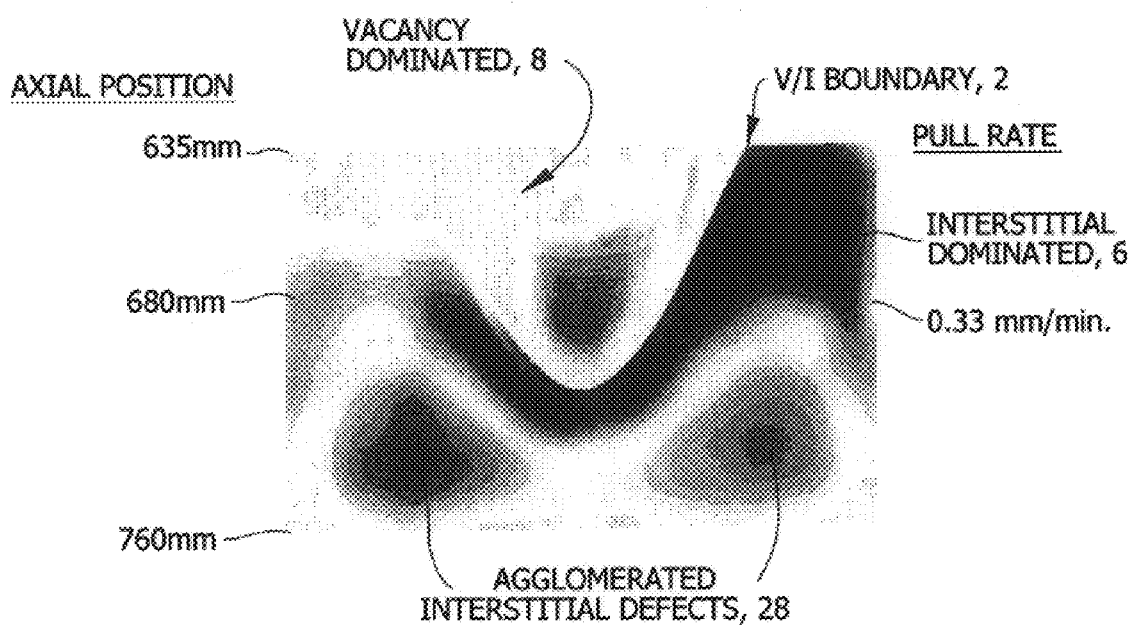
FIG. 15 is an image produced by a scan of the minority carrier lifetime of an axial cut of the ingot following a series of oxygen precipitation heat treatments, as described in Example 1.

FIG. 15 is an image produced by a scan of the minority carrier lifetime of an axial cut of the ingot over a section ranging from about 635 mm to about 760 mm from the shoulder of the ingot following a series of oxygen precipitation heat-treatments which reveal defect distribution patterns. At a crystal position of about 680 mm, a band of agglomerated interstitial defects 28 can be seen. This position corresponds to a critical pull rate of v*(680 mm)=0.33 mm/min. At this point, the width of the axially symmetric region 6 (a region which is interstitial dominated material but which lacks agglomerated interstitial defects) is at its maximum; the width of the vacancy dominated region 8, $R_v^*(680)$ is about 35 mm and the width of the axially symmetric region, $R_I^*(680)$ is about 65 mm.

Figure 16:
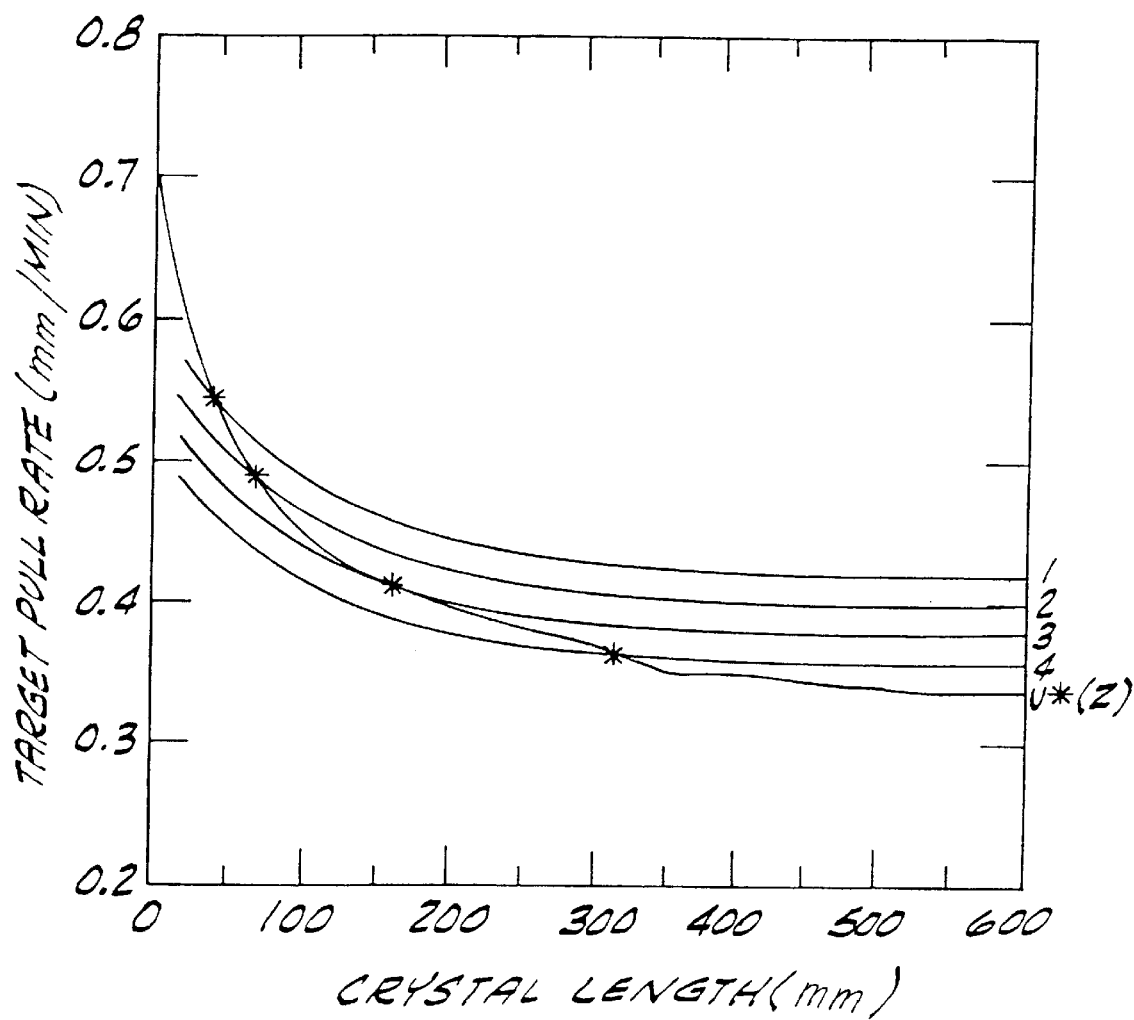
FIG. 16 is a graph of pull rate as a function of crystal length for each of four single crystal silicon ingots, labeled 1–4 respectively, which are used to yield a curve, labeled v* (Z), as described in Example 1.

A series of four single crystal silicon ingots were then grown at steady state pull rates which were somewhat greater than and somewhat less than the pull rate at which the maximum width of the axially symmetric region of the first 200 mm ingot was obtained. FIG. 16 shows the pull rate as a function of crystal length for each of the four crystals, labeled, respectively, as 1–4. These four crystals were then analyzed to determine the axial position (and corresponding pull rate) at which agglomerated interstitial defects first appear or disappear. These four empirically determined points (marked "*") are shown in FIG. 16. Interpolation between and extrapolation from these points yielded a curve, labeled v*(Z) in FIG. 16. This curve represents, to a first approximation, the pull rate for 200 mm crystals as a function of length in the crystal puller at which the axially symmetric region is at its maximum width.

Growth of additional crystals at other pull rates and further analysis of these crystals would further refine the empirical definition of v*(Z).

EXAMPLE 2

Reduction of Radial Variation in $G_0(r)$

Figure 17:
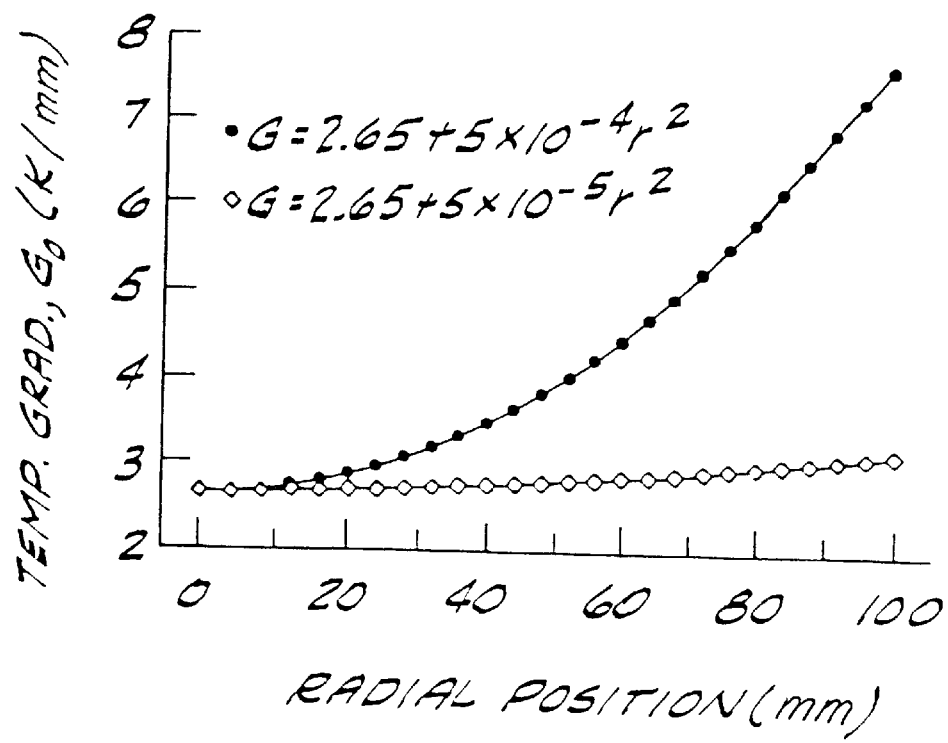
FIG. 17 is a graph of the axial temperature gradient at the crystal/melt interface, $G_0$, as a function of radial position, for two different cases as described in Example 2.
Figure 18:
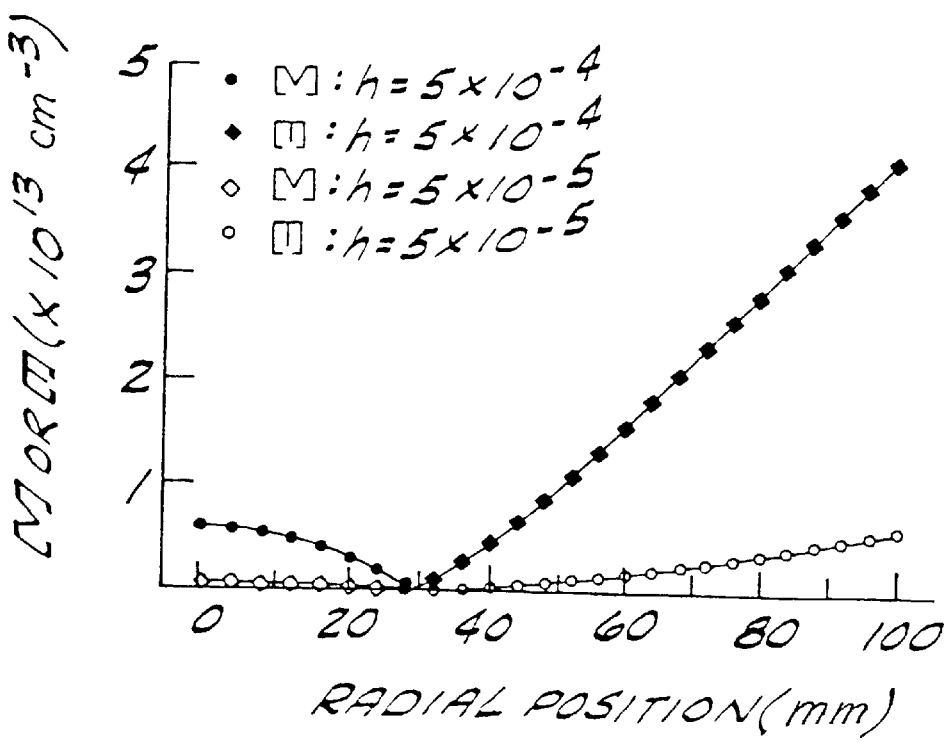
FIG. 18 is a graph of the initial concentration of vacancies, [V], or self-interstitials, [I], as a function of radial position, for two different cases as described Example 2.

FIGS. 17 and 18, illustrate the improvement in quality that can be achieved by reduction of the radial variation in the axial temperature gradient at the crystal/melt interface, $G_0(r)$. The initial concentration (about 1 cm from the crystal/melt interface) of vacancies and interstitials are calculated for two cases with different $G_0(r)$: (1) $G_0(r)=2.65+5\times10^{-4}r^2$ (K/mm) and (2) $G_0(r)=2.65+5\times10^{-5}r^2$ (K/mm). For each case the pull rate was adjusted such that the boundary between vacancy-rich silicon and interstitial-rich silicon is at a radius of 3 cm. The pull rate used for case 1 and 2 were 0.4 and 0.35 mm/min, respectively. From FIG. 18 it is clear that the initial concentration of interstitials in the interstitial-rich portion of the crystal is dramatically reduced as the radial variation in the initial axial temperature gradient is reduced. This leads to an improvement in the reality of the material since it becomes easier to avoid the formation of interstitial defect clusters due to supersaturation of interstitials.

EXAMPLE 3

Increased Out-diffusion Time for Interstitials

Figure 19:
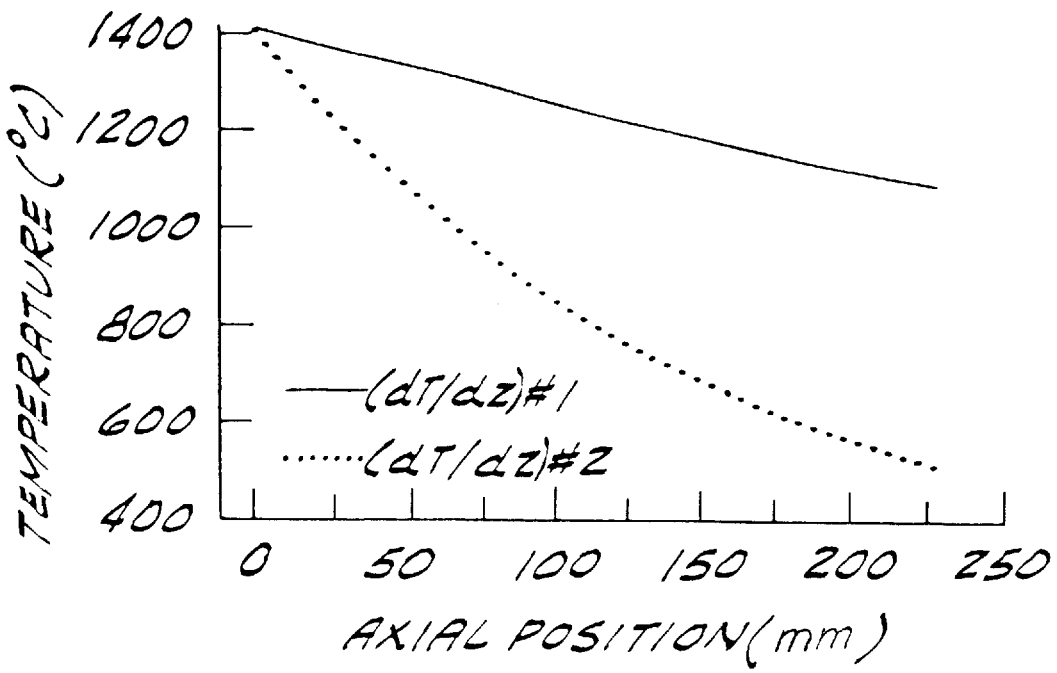
FIG. 19 is a graph of temperature as a function of axial position, showing the axial temperature profile in ingots for two different cases as described in Example 3.
Figure 20:
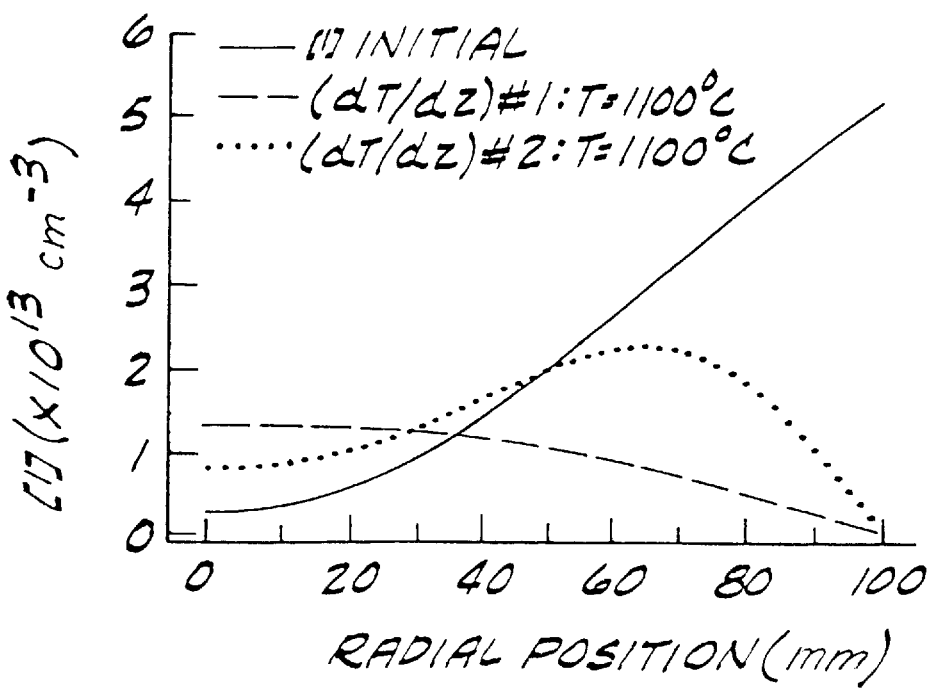
FIG. 20 is a graph of the self-interstitial concentrations resulting from the two cooling conditions illustrated in FIG. 19 and as more fully described in Example 3.
Figure 21:
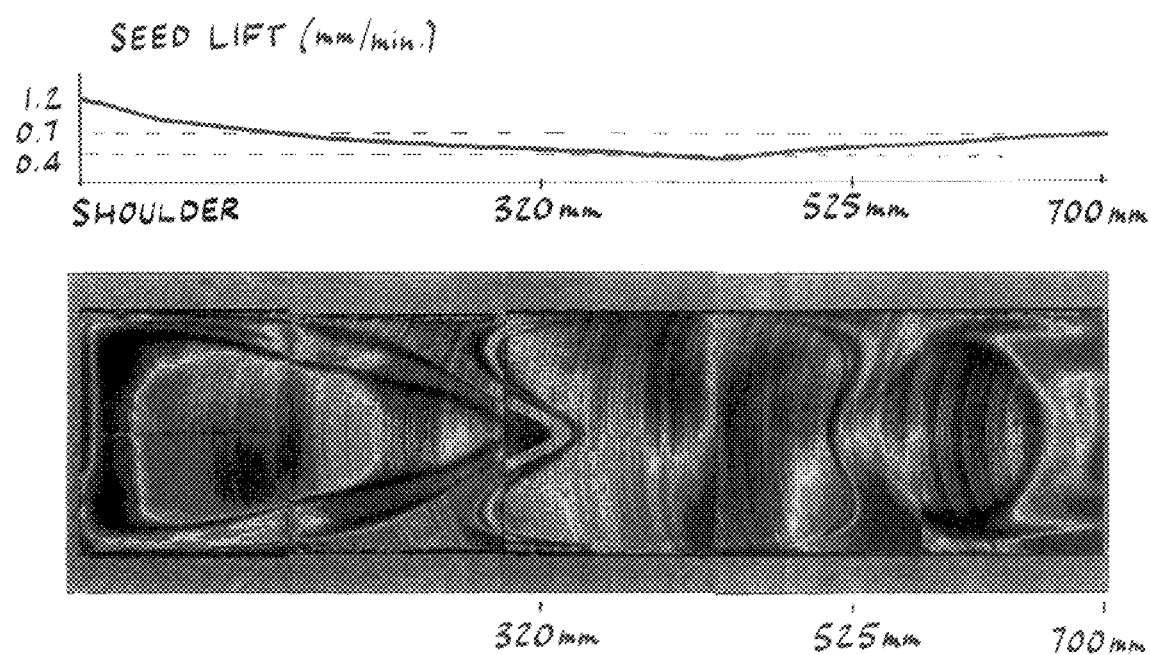
FIG. 21 is an image produced by a scan of the minority carrier lifetime of an axial cut of an entire ingot following a series of oxygen precipitation heat treatments, as described in Example 4.

FIGS. 19 and 20 illustrate the improvement in quality that can be achieved by increasing the time for out-diffusion of interstitials. The concentration of interstitials is calculated for two cases with differing axial temperature profiles in the crystal, dT/dz. The axial temperature gradient at the crystal/melt interface is the same for both cases, so that the initial concentration (about 1 cm from the crystal/melt interface) of interstitials is the same for both cases. In this example, the pull rate was adjusted such that the entire crystal is interstitial-rich. The pull rate was the sane for both cases, 0.32 mm/min. The longer time for interstitial out-diffusion in case 2 results in an overall reduction of the interstitial concentration. This leads to an improvement in the quality of the material since it becomes easier to avoid the formation of interstitial defect clusters due to supersaturation of interstitials.

EXAMPLE 4

A 700 mm long, 150 mm diameter crystal was grown with a varying pull rate. The pull rate varied nearly linearly from 1.2 mm/min at the shoulder to 0.4 mm/min at 430 mm from the shoulder, and then nearly linearly back to 0.65 mm/min at 700 mm from the shoulder. Under these conditions in this particular crystal puller, the entire radius is grown under interstitial-rich conditions over the length of crystal about 320 mm to about 525 mm from the shoulder of the crystal. At an axial position of about 525 mm and a pull rate of about 0.47 mm/min, the crystal is free of agglomerated intrinsic point defects clusters across the entire diameter. Stated another way, there is one small section of the crystal in which the width of the axially symmetric region, i.e., the region which is substantially free of agglomerated defects, is equal to the radius of the ingot.

In view of the above, it will be seen that the several objects of the invention are achieved.

As various changes could be made in the above compositions and processes without departing from the scope of the invention, it is intended that all matter contained in the above description be interpreted as illustrative and not in a limiting sense.

What is claimed is:

1. A single crystal silicon wafer having a central axis, a front side and a back side which are generally perpendicular to the axis, a circumferential edge, and a radius extending from the central axis to the circumferential edge of the wafer, and a nominal diameter of 150 mm, 200 mm, or greater than 200 mm, the wafer comprising an axially symmetric region which is substantially free of agglomerated intrinsic point defects, the axially symmetric region extending radially inwardly from the circumferential edge of the wafer and having a width, as measured from the circumferential edge radially toward the center axis, which is about equal to the length of the radius.

2. The wafer as set forth in claim 1 wherein the wafer has as oxygen content which is less than about 13 PPMA.

3. The wafer as set forth in claim 1 wherein the wafer has as oxygen content which is less than about 11 PPMA.

4. The wafer as set forth in claim 1 wherein the wafer has an absence of oxygen precipitate nucleation centers.

5. A single crystal silicon ingot having a central axis, a seed-cone, an end-cone, and a constant diameter portion between the seed-cone and the end-cone having a circumferential edge and a radius extending from the central axis to the circumferential edge, and a nominal diameter of 150 mm, 200 mm, or greater than 200 mm, the single crystal silicon ingot being characterized in that after the ingot is grown and cooled from the solidification temperature, the constant diameter portion contains an axially symmetric region which is substantially free of agglomerated intrinsic point defects wherein the axially symmetric region extends radially inwardly from a circumferential edge of the ingot, has a width as measured from the circumferential edge radially toward the central axis of the ingot which is at least about 30% the length of the radius of the constant diameter portion, and has a length as measured along the central axis of at least about 80% the length of the constant diameter portion of the ingot.

6. The single crystal silicon ingot as set forth in claim 5 wherein the length of the axially symmetric region is about equal to the length of the constant diameter portion of the ingot.

7. The single crystal silicon ingot as set forth in claim 6 wherein the width of the axially symmetric region is at least about 60% the length of the radius of the constant diameter portion of the ingot.

8. The single crystal silicon ingot as set forth in claim 6 wherein the width of the axially symmetric region is about equal to the length of the radius of the constant diameter portion of the ingot.

9. A single crystal silicon wafer having a central axis, a front side and a back side which are generally perpendicular to the axis, a circumferential edge, and a radius extending from the central axis to the circumferential edge of the wafer, and a nominal diameter of 150 mm, 200 mm, or greater than 200 mm, the wafer comprising an axially symmetric region which is substantially free of agglomerated intrinsic point defects, the axially symmetric region extending radially inwardly from the circumferential edge of the wafer and having a width, as measured from the circumferential edge radially toward the center axis, which is at least about 30% the length of the radius, wherein silicon self-interstitials are the predominant intrinsic point defect in the axially symmetric region.

10. The wafer as set forth in claim 9 wherein the width of the axially symmetric region is at least about 40% the length of the radius.

11. The wafer as set forth in claim 9 wherein the width of the axially symmetric region is at least about 60% the length of the radius.

12. The wafer as set forth in claim 9 wherein the width of the axially symmetric region is at least about 80% the length of the radius.

13. The wafer as set forth in claim 9 wherein the width of the axially symmetric region is about equal to the length of the radius.

14. The wafer as set forth in claim 9 wherein the wafer has as oxygen content which is less than about 13 PPMA.

15. The wafer as set forth in claim 9 wherein the wafer has as oxygen content which is less than about 11 PPMA.

16. The wafer as set forth in claim 9 wherein the wafer has an absence of oxygen precipitate nucleation centers.

17. A single crystal silicon ingot having a central axis, a seed-cone, an end-cone, and a constant diameter portion between the seed-cone and the end-cone having a circumferential edge and a radius extending from the central axis to the circumferential edge, and a nominal diameter of 150 mm, 200 mm, or greater than 200 mm, the single crystal silicon ingot being characterized in that after the ingot is grown and cooled from the solidification temperature, the constant diameter portion contains an axially symmetric region which is substantially free of agglomerated intrinsic point defects wherein the axially symmetric region extends radially inwardly from a circumferential edge of the ingot, has a width as measured from the circumferential edge radially toward the central axis of the ingot which is at least about 30% the length of the radius of the constant diameter portion, and has a length as measured along the central axis of at least about 20% the length of the constant diameter portion of the ingot, wherein silicon self-interstitials are the predominant intrinsic point defect in the axially symmetric region.

18. The single crystal silicon ingot as set forth in claim 17 wherein the length of the axially symmetric region is at least about 40% the length of the constant diameter portion of the ingot.

19. The single crystal silicon ingot as set forth in claim 17 wherein the length of the axially symmetric region is at least about 60% the length of the constant diameter portion of the ingot.

20. The single crystal silicon ingot as set forth in claim 17 wherein the length of the axially symmetric region is at least about 80% the length of the constant diameter portion of the ingot.

21. The single crystal silicon ingot as set forth in claim 17 wherein the length of the axially symmetric region is about equal to the length of the constant diameter portion of the ingot.

22. The single crystal silicon ingot as set forth in claim 17 wherein the width of the axially symmetric region is at least about 40% the length of the radius of the constant diameter portion of the ingot.

23. The single crystal silicon ingot as set forth in claim 22 wherein the length of the axially symmetric region is at least about 40% the length of the constant diameter portion of the ingot.

24. The single crystal silicon ingot as set forth in claim 22 wherein the length of the axially symmetric region is at least about 60% the length of the constant diameter portion of the ingot.

25. The single crystal silicon ingot as set forth in claim 22 wherein the length of the axially symmetric region is at least about 80% the length of the constant diameter portion of the ingot.

26. The single crystal silicon ingot as set forth in claim 22 wherein the length of the axially symmetric region is about equal to the length of the constant diameter portion of the ingot.

27. The single crystal silicon ingot as set forth in claim 17 wherein the width of the axially symmetric region is at least about 60% the length of the radius of the constant diameter portion of the ingot.

28. The single crystal silicon ingot as set forth in claim 27 wherein the length of the axially symmetric region is at least about 40% the length of the constant diameter portion of the ingot.

29. The single crystal silicon ingot as set forth in claim 27 wherein the length of the axially symmetric region is at least about 60% the length of the constant diameter portion of the ingot.

30. The single crystal silicon ingot as set forth in claim 27 wherein the length of the axially symmetric region is at least about 80% the length of the constant diameter portion of the ingot.

31. The single crystal silicon ingot as set forth in claim 27 wherein the length of the axially symmetric region is about equal to the length of the constant diameter portion of the ingot.

32. The single crystal silicon ingot as set forth in claim 27 wherein the width of the axially symmetric region is at least about 80% the length of the radius of the constant diameter portion of the ingot.

33. The single crystal silicon ingot as set forth in claim 32 wherein the length of the axially symmetric region is at least about 40% the length of the constant diameter portion of the ingot.

34. The single crystal silicon ingot as set forth in claim 22 wherein the length of the axially symmetric region is at least about 60% the length of the constant diameter portion of the ingot.

35. The single crystal silicon ingot as set forth in claim 32 wherein the length of the axially symmetric region is at least about 80% the length of the constant diameter portion of the ingot.

36. The single crystal silicon ingot as set forth in claim 32 wherein the length of the axially symmetric region is about equal to the length of the constant diameter portion of the ingot.

37. The single crystal silicon ingot as set forth in claim 17 wherein the width of the axially symmetric region is at least about equal to the length of the radius of the constant diameter portion of the ingot.

38. The single crystal silicon ingot as set forth in claim 37 wherein the length of the axially symmetric region is at least about 40% the length of the constant diameter portion of the ingot.

39. The single crystal silicon ingot as set forth in claim 37 wherein the length of the axially symmetric region is at least about 60% the length of the constant diameter portion of the ingot.

40. The single crystal silicon ingot as set forth in claim 37 wherein the length of the axially symmetric region is at least about 80% the length of the constant diameter portion of the ingot.

41. The single crystal silicon ingot as set forth in claim 37 wherein the length of the axially symmetric region is about equal to the length of the constant diameter portion of the ingot.

* * * * *

UNITED STATES PATENT AND TRADEMARK OFFICE
CERTIFICATE OF CORRECTION

PATENT NO.    : 6,605,150 B2
DATED         : August 12, 2003
INVENTOR(S)   : Robert J. Falster and Joseph C. Holzer It is certified that error appears in the above-identified patent and that said Letters Patent is hereby corrected as shown below:

Column 16,
Lines 38-39, "has as oxygen" should read -- has an oxygen --.
Lines 40-41, "has as oxygen" should read -- has an oxygen --.

Column 17,
Lines 31-32, "has as oxygen" should read -- has an oxygen --.
Lines 33-34, "has as oxygen" should read -- has an oxygen --.

Column 18,
Line 55, "claim 22" should read -- claim 32 --.

Signed and Sealed this

Thirtieth Day of December, 2003

JAMES E. ROGAN
*Director of the United States Patent and Trademark Office*